(12) United States Patent
Mizuno

(10) Patent No.: US 8,770,165 B2
(45) Date of Patent: Jul. 8, 2014

(54) AUTOMATIC ENGINE CONTROL DEVICE

(75) Inventor: Satoru Mizuno, Okazaki (JP)

(73) Assignee: Denso Corporation, Kariya (JP)

( * ) Notice: Subject to any disclaimer, the term of this patent is extended or adjusted under 35 U.S.C. 154(b) by 861 days.

(21) Appl. No.: 12/762,553

(22) Filed: Apr. 19, 2010

(65) Prior Publication Data

US 2010/0269776 A1    Oct. 28, 2010

(30) Foreign Application Priority Data

Apr. 23, 2009  (JP) ................................. 2009-105488
Jan. 18, 2010  (JP) ................................. 2010-008318

(51) Int. Cl.
*F02N 11/08* (2006.01)

(52) U.S. Cl.
USPC ...................... 123/179.4; 123/179.3; 701/113

(58) Field of Classification Search
USPC ................ 123/179.4, 179.28, 179.3; 701/113
See application file for complete search history.

(56) References Cited

U.S. PATENT DOCUMENTS

| | | | |
|---|---|---|---|
| 6,202,615 B1 * | 3/2001 | Pels et al. ................... | 123/179.3 |
| 6,424,157 B1 * | 7/2002 | Gollomp et al. ............. | 324/430 |
| 7,330,105 B2 * | 2/2008 | Chew et al. .................. | 340/455 |
| 7,805,264 B2 | 9/2010 | Mizuno et al. | |
| 2007/0103284 A1 | 5/2007 | Chew et al. | |
| 2007/0200567 A1 | 8/2007 | Mizuno et al. | |
| 2009/0115419 A1 * | 5/2009 | Ueda et al. ................... | 324/430 |
| 2009/0183557 A1 * | 7/2009 | Ono ........................... | 73/114.25 |

FOREIGN PATENT DOCUMENTS

| | | |
|---|---|---|
| JP | A-58-023250 | 2/1983 |
| JP | A-58-123479 | 7/1983 |
| JP | A-58-140445 | 8/1983 |
| JP | A-10-47105 | 2/1998 |
| JP | A-2002-31671 | 1/2002 |
| JP | A-2002-174133 | 6/2002 |
| JP | A-2005-274214 | 10/2005 |
| JP | A-2007-223530 | 9/2007 |
| JP | A-2007-285172 | 11/2007 |
| JP | A-2008-94211 | 4/2008 |
| JP | A-2008-107168 | 5/2008 |
| JP | A-2008-216018 | 9/2008 |
| JP | A-2008-260506 | 10/2008 |
| JP | A-2009-42091 | 2/2009 |

OTHER PUBLICATIONS

Japanese Office Action dated Mar. 1, 2011 issued in Japanese Patent Application No. 2010-008318 (with translation).
Oct. 19, 2011 Office Action issued in JP Application No. 2010-008318 (with English translation).

(Continued)

*Primary Examiner* — Erick Solis
*Assistant Examiner* — Anthony L Bacon
(74) *Attorney, Agent, or Firm* — Oliff PLC

(57) ABSTRACT

An ECU in an automatic engine control device predicts a maximum discharging current to be supplied from a battery to a starter during a next restart of the engine based on a present voltage, an internal resistance value of the battery, and a starter total resistance value during automatic engine stop. The ECU further predicts a minimum voltage of the battery during a period until the next restart of the engine based on the present voltage, the present internal resistance value of the battery, and the predicted maximum discharging current. The ECU judges whether or not execution of the next restart of the engine during the automatic engine stop based on the predicted minimum voltage of the battery.

20 Claims, 12 Drawing Sheets

(56) References Cited

OTHER PUBLICATIONS

May 7, 2013 Office Action issued in Japanese Patent Application No. 2010-008318 w/translation.

Feb. 7, 2013 Office Action issued in Chinese Patent Application No. 201010167143.3 (with English translation).

* cited by examiner

AUTOMATIC ENGINE CONTROL DEVICE

CROSS-REFERENCE TO RELATED APPLICATION

This application is related to and claims priority from Japanese Patent Applications No. 2009-105488 filed on Apr. 23, 2009, and No. 2010-8318 filed on Jan. 18, 2010, the contents of which are hereby incorporated by reference.

BACKGROUND OF THE INVENTION

1. Field of the Invention

The present invention relates to automatic engine control devices capable of controlling an automatic engine stop of an internal combustion engine.

2. Description of the Related Art

Recently, some types of vehicles are equipped with an automatic engine control device. The automatic engine control device controls an automatic engine stop in order to stop an internal combustion engine during an idle state of the engine mounted to the vehicle. The execution of the automatic engine stop decreases a terminal voltage of an on-vehicle battery of the vehicle. Specifically, at the moment when the automatic engine control device switches the state of the engine from the idling state to an engine restart mode, a large amount of current is supplied from the on-vehicle battery to a starter mounted to the vehicle. Such a large amount of current drastically decreases the terminal voltage of the battery, that is, reduces a large amount of capacity of the on-vehicle battery.

As a result, it is difficult for the on-vehicle battery to supply an adequate amount of electric power to the starter when the terminal voltage of the battery is less than a predetermined voltage, it becomes difficult for the starter to restart the internal combustion engine. Accordingly, it is necessary for the on-vehicle battery to keep the voltage of not less than the predetermined voltage during engine idle stop (that is, idle reduction).

By the way, for example, Japanese patent laid open publication No. JP 2002-31671 discloses a conventional technique to judge whether the execution of the engine idle stop control is permitted or not based on various judgment conditions: (1) whether or not a SOC (State Of Charge as a residual capacity, for example) of the on-vehicle battery is not less than a total of a necessary capacity to restart the internal combustion engine and a standard capacity of the on-vehicle battery to be consumed by electrical loads during the engine idle stop.

There is a recent demand for vehicles to execute the engine idle stop multiple times as many as possible, and to extend a period of the engine idle stop from the viewpoint of solving recent environmental issues.

SUMMARY OF THE INVENTION

It is an object of the present invention to provide an automatic engine control device capable of ensuring the operation to restart an internal combustion engine based on an estimated minimum voltage of a battery with high accuracy at the restart of the internal combustion engine.

To achieve the above purpose, the present invention provides first to six aspects of the automatic engine control device as follows.

(First Aspect of the Present Invention Regarding the Judgment of Engine Restart)

In accordance with the first aspect of the present invention, there is provided an automatic engine control device that controls an automatic engine stop and a restart of an internal combustion engine mounted to a vehicle. The automatic engine control device has a battery such as an on-vehicle battery, a starter such as a starter motor, a voltage detection means, a present battery internal resistance value obtaining means, a starter total resistance value calculating means, and a discharging current predicting means. The battery charges and discharges electric power. The starter is electrically connected to the battery through conductive wiring. The starter works to start the internal combustion engine when receiving electric power supplied from the battery. The voltage detection means detects a voltage of the battery. The present battery internal resistance value obtaining means obtains a present internal resistance value of the battery. The starter total resistance value calculating means calculates a starter total resistance value of the starter which is a total of an internal resistance value of the starter and a wiring resistance value of the conductive wiring. The discharging current predicting means predicts a discharging current to be supplied from the battery to the starter during an automatic engine stop based on a present voltage of the battery, the present internal resistance value of the battery, and the starter total resistance value. During the automatic engine stop, the voltage predicting means predicts a voltage of the battery in a period until the next restart of the engine based on the present voltage, the present internal resistance value of the battery and the predicted discharging current. During the automatic engine stop, the engine restart judging means judges whether or not the next restart of the engine is permitted based on the predicted voltage.

The starter is electrically connected to the battery through the conductive wiring. That is, the battery and the conductive wiring form a closed circuit. Accordingly, the current flowing through the closed circuit is changed according to the wiring resistance of the conductive wiring and the internal resistance value of the starter. The present invention predicts the discharging current to be supplied from the battery to the starter at the next engine start in consideration of the wiring resistance of the conductive wiring and the internal resistance value of the starter. It is thereby possible to calculate the discharging current to be supplied from the battery to the starter at the next restart of the engine with high accuracy. This makes it possible to predict the voltage of the battery with high accuracy during the period until the next restart of the engine in the automatic engine stop. That is, this can prevent the voltage of the battery from becoming less than the predetermined threshold voltage. As a result, it is possible for the automatic engine control device according to the first aspect of the present invention to guarantee the next restart of the engine with high reliability.

(Second Aspect of the Present Invention Regarding the Judgment of Engine Restart)

In accordance with the second aspect of the present invention, there is provided an automatic engine control device that controls an automatic engine stop and a restart of an internal combustion engine mounted to a vehicle. The automatic engine control device has a battery, a starter, a voltage detection means, a present battery internal resistance value obtaining means, a starter total resistance value calculating means, a maximum discharging current predicting means, a minimum voltage predicting means, and an engine restart judging means. The battery charges and discharges electric power. The starter is electrically connected to the battery through a conductive wiring. The starter works to start the internal combustion engine when receiving electric power supplied from the battery. The voltage detection means detects a voltage of the battery. The present battery internal resistance value obtaining means obtains a present internal resistance value of the battery. The starter total resistance value calculating means calculates a starter total resistance value of the starter which is a total of an internal resistance value of the starter and a wiring resistance value of the conductive wiring. The maximum discharging current predicting means predicts a maximum discharging current to be supplied from the battery to the starter during an automatic engine stop based on a present voltage of the battery, the present internal resistance value of the battery, and the starter total resistance value. During the automatic engine stop, the minimum voltage predicting means predicts a minimum voltage of the battery in a period until the next restart of the engine based on the present voltage, the present internal resistance value of the battery and the predicted maximum discharging current. During the automatic engine stop, the engine restart judging means judges whether or not the next restart of the engine is permitted based on the predicted minimum voltage.

The starter is electrically connected to the battery through the conductive wiring. That is, the battery and the conductive wiring form a closed circuit. Accordingly, the current flowing through the closed circuit is changed according to the wiring resistance of the conductive wiring and the internal resistance value of the starter. The second aspect of the present invention predicts the maximum discharging current to be supplied from the battery to the starter at the next engine start in consideration of the wiring resistance of the conductive wiring and the internal resistance value of the starter. It is thereby possible to calculate the maximum discharging current to be supplied from the battery to the starter at the next restart of the engine with high accuracy. This makes it possible to predict the minimum voltage of the battery with high accuracy. That is, this can prevent the voltage of the battery from becoming less than the predetermined threshold voltage. As a result, it is possible for the automatic engine control device according to the second aspect of the present invention to guarantee the next restart of the engine with high reliability.

(Third Aspect of the Present Invention Regarding the Judgment of Automatic Engine Stop)

In accordance with the third aspect of the present invention, there is provided an automatic engine control device that controls an automatic engine stop and a restart of an internal combustion engine mounted to a vehicle. The automatic engine control device according to the third aspect of the present invention has a battery, a starter, an electric generator, a voltage detection means, a present battery internal resistance value obtaining means, a starter total resistance value calculating means, a discharging current predicting means, a voltage predicting means, and an automatic engine stop permission judging means. The battery charges and discharges electric power. The starter is electrically connected to the battery through a conductive wiring. The starter works to start the internal combustion engine when receiving electric power supplied from the battery. The electric generator is driven by the internal combustion engine, and generates electric power. The voltage detection means detects a voltage of the battery. The present battery internal resistance value obtaining means obtains a present internal resistance value of the battery. The starter total resistance value calculating means calculates a starter total resistance value which is a total of an internal resistance value of the starter and a wiring resistance value of the conductive wiring. The discharging current predicting means predicts a discharging current to be supplied from the battery to the starter based on a present voltage of the battery, the present internal resistance value of the battery, and the starter total resistance value. During the working of the engine and the stop of the electric generator, the voltage predicting means predicts a voltage of the battery when the engine is automatically stopped during a period until the next restart of the engine based on the present voltage of the battery, the present internal resistance value of the battery, and the predicted discharging current. The automatic engine stop permission judging means judges whether or not the stop of the engine is permitted during the working of the engine based on the predicted voltage of the battery.

In a case where the engine is working and the electric generator such as an AC generator mounted to a vehicle is stopped, the electric load such as various types of on-vehicle devices consumes the electric power charged in the battery. That is, when the engine is working and the electric generator is stopped, the battery is substantially equal in condition to the idle stop state (or idle reduction state) of the engine. Like the first and second aspects of the present invention regarding the engine restarting judgment previously described, this case as the third aspect of the present invention can judge whether or not the execution of the automatic engine stop is permitted based on the present battery voltage and the total resistance value of the present internal resistance value of the battery and the starter sum resistance value. This starter sum resistance value is a total of the internal resistance value of the starter and the wiring resistance value of the conductive wiring. This makes it possible to predict with high accuracy the voltage of the battery during the period until the engine restart after the engine is automatically stopped. That is, this makes it possible to prevent the voltage of the battery from becoming less than the predetermined threshold value. As a result, it is possible for the automatic engine control device according to the third aspect of the present invention to guarantee the next restart of the engine with high reliability.

(Fourth Aspect of the Present Invention Regarding the Judgment of Automatic Engine Stop)

In accordance with the fourth aspect of the present invention, there is provided an automatic engine control device that controls an automatic engine stop and a restart of an internal combustion engine mounted to a vehicle. The automatic engine control device according to the fourth aspect of the present invention has a battery, a starter, an electric generator, a voltage detection means, a present battery internal resistance value obtaining means, a starter total resistance value calculating means, a maximum discharging current predicting means, a minimum voltage predicting means, and an automatic engine stop permission judging means.

The battery charges and discharges electric power. The starter is electrically connected to the battery through a conductive wiring. The starter works to start the internal combustion engine when receiving electric power supplied from the battery. The electric generator is driven by the internal combustion engine, and generates electric power. The voltage detection means detects a voltage of the battery. The present battery internal resistance value obtaining means obtains a present internal resistance value of the battery. The starter total resistance value calculating means calculates a starter total resistance value of the starter which is a total of an internal resistance value of the starter and a wiring resistance value of the conductive wiring. The maximum discharging current predicting means predicts a maximum discharging current to be supplied from the battery to the starter based on a present voltage of the battery, the present internal resistance value of the battery, and the starter total resistance value. During the working of the engine and the stop of the electric generator, the minimum voltage predicting means predicts, a minimum voltage of the battery when the engine is automatically stopped during a period until the next restart of the engine based on the present voltage of the battery, the present internal resistance value of the battery, and the predicted maximum discharging current. During the working of the engine, the automatic engine stop permission judging means judges whether or not the stop of the engine is permitted based on the predicted minimum voltage of the battery.

According to the fourth aspect of the present invention, the automatic engine control device judges the permission to perform the automatic engine stop based on the minimum voltage of the battery during the period until the next restart of the engine after the automatic engine stop. This minimum voltage of the battery is calculated based on the maximum discharging current to be supplied from the battery to the starter until the next restart of the engine. This makes it possible to predict the minimum voltage of the battery with high accuracy during the period until the engine restart after the automatic engine stop. That is, this makes it possible to prevent the voltage of the battery from becoming less than the predetermined threshold value. As a result, it is possible for the automatic engine control device according to the fourth aspect of the present invention to guarantee the next restart of the engine with high reliability.

(Fifth Aspect of the Present Invention Regarding the Judgment to Start Driving of Electric Generator)

In accordance with the fifth aspect of the present invention, there is provided an automatic engine control device that controls an automatic engine stop and a restart of an internal combustion engine mounted to a vehicle. The automatic engine control device according to the fifth aspect of the present invention has a battery, a starter, an electric generator, a voltage detection means, a present battery internal resistance value obtaining means, a starter total resistance value calculating means, a discharging current predicting means, a voltage predicting means, and an electric generator driving permission judging means. The battery charges and discharges electric power. The starter is electrically connected to the battery through a conductive wiring. The starter works to start the internal combustion engine when receiving electric power supplied from the battery. The electric generator is driven by the internal combustion engine, and generates electric power. The voltage detection means detects a voltage of the battery. The present battery internal resistance value obtaining means obtains a present internal resistance value of the battery. The starter total resistance value calculating means calculates a starter total resistance value of the starter which is a total of an internal resistance value of the starter and a wiring resistance value of the conductive wiring. The discharging current predicting means predicts a discharging current to be supplied from the battery to the starter based on a present voltage of the battery, the present internal resistance value of the battery, and the starter total resistance value. During the working of the engine and the stop of the electric generator, the voltage predicting means predicts a voltage of the battery when the engine is automatically stopped during a period until a next restart of the engine based on the present voltage of the battery, the present internal resistance value of the battery, and the predicted discharging current. During the working of the engine and the stop of the electric generator, the electric generator driving permission judging means judges whether or not start to drive the electric generator is permitted based on the predicted voltage of the battery.

In a case where the engine is working and the electric generator such as an AC generator mounted to a vehicle is stopped, the electric load such as various types of on-vehicle devices consumes the electric power charged in the battery. Restarting the engine after the automatic engine stop drastically decreases the voltage of the battery. Therefore there is a possibility not to perform the automatic engine stop when the voltage of the battery is less than the predetermined threshold value. According to the fifth aspect of the present invention, the automatic engine control device starts to drive the electric generator in order to charge the battery when judging to be difficult to restart the engine after the automatic engine stop by the electric power charged in the battery. That is, when the engine is now working and the AC generator is stopped, the automatic engine control device judges the permission to start to drive the electric generator based on the present voltage of the battery, the present internal resistance value of the battery, and the starter total resistance value. It is thereby possible for the fifth aspect of the present invention to predict the voltage of the battery with high accuracy during the period until the engine restart after the automatic engine stop. This makes it possible to prevent the voltage of the battery from becoming less than the predetermined threshold value.

(Sixth Aspect of the Present Invention Regarding the Judgment to Start Driving of Electric Generator)

In accordance with the sixth aspect of the present invention, there is provided an automatic engine control device that controls an automatic engine stop and a restart of an internal combustion engine mounted to a vehicle. The automatic engine control device according to the sixth aspect of the present invention has a battery, a starter, an electric generator, a voltage detection means, a present battery internal resistance value obtaining means, a starter total resistance value calculating means, a maximum discharging current predicting means, a minimum voltage predicting means, and an electric generator driving permission judging means.

The battery charges and discharges electric power. The starter is electrically connected to the battery through a conductive wiring. The starter works to start the internal combustion engine when receiving electric power supplied from the battery. The electric generator is driven by the internal combustion engine, and generates electric power. The voltage detection means detects a voltage of the battery. The present battery internal resistance value obtaining means obtains a present internal resistance value of the battery. The starter total resistance value calculating means calculates a starter total resistance value of the starter which is a total of an internal resistance value of the starter and a wiring resistance value of the conductive wiring. The maximum discharging current predicting means predicts a maximum discharging current to be supplied from the battery to the starter based on a present voltage of the battery, the present internal resistance value of the battery, and the starter total resistance value.

During the working of the engine and the stop of the electric generator, the minimum voltage predicting means predicts, a minimum voltage of the battery when the engine is automatically stopped during a period until a next restart of the engine based on the present voltage of the battery, the present internal resistance value of the battery, and the predicted maximum discharging current. During the working of the engine and the stop of the electric generator, the electric generator driving permission judging means judges whether or not start to drive the electric generator is permitted based on the predicted minimum voltage of the battery.

According to the sixth aspect of the present invention, the automatic engine control device judges the permission to perform the automatic engine stop based on the minimum voltage of the battery during the period until the next restart of the engine after the automatic engine stop. This minimum voltage of the battery is calculated based on the maximum discharging current to be supplied from the battery to the starter until the next restart of the engine. This makes it possible to predict the minimum voltage of the battery with high accuracy during the period until the engine restart after the automatic engine stop. That is, this makes it possible to prevent the voltage of the battery from becoming less than the predetermined threshold value.

BRIEF DESCRIPTION OF THE DRAWINGS

A preferred, non-limiting embodiment of the present invention will be described by way of example with reference to the accompanying drawings, in which:

FIG. 18A shows a case where the battery has a voltage Vreal1 at the present time, and FIG. 18B shows a case where the battery has a voltage Vreal2 at the present time.

DETAILED DESCRIPTION OF THE PREFERRED EMBODIMENTS

Figure 1:
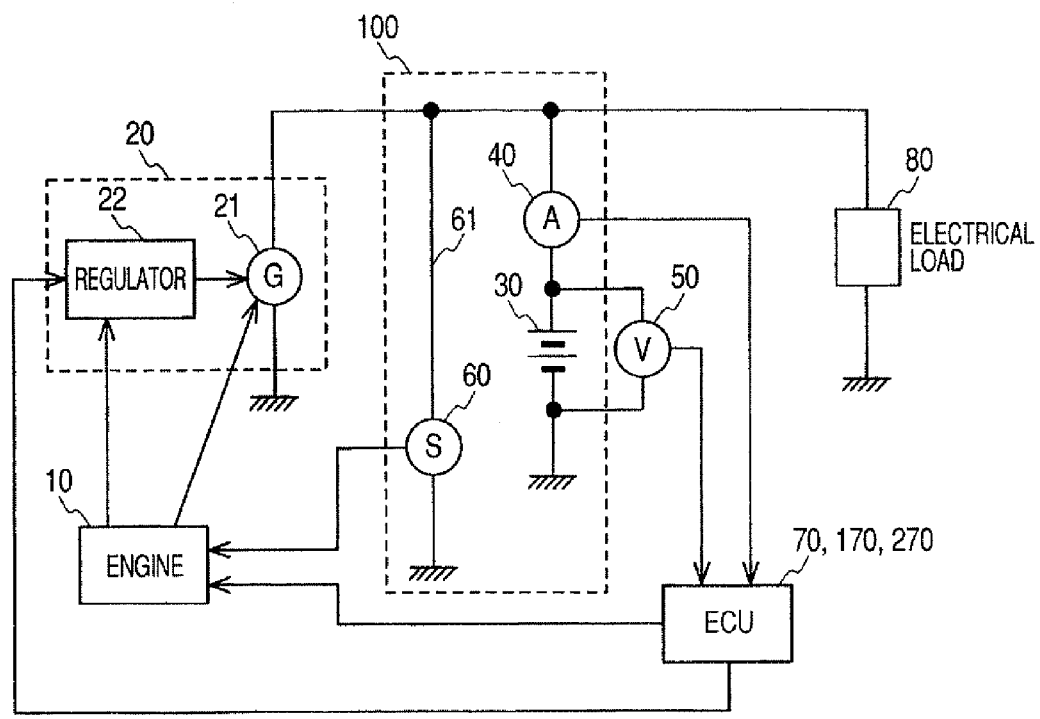
FIG. 1 is a block diagram showing an entire system structure of an automatic engine control device according to the present invention.

Hereinafter, various embodiments of the present invention will be described with reference to the accompanying drawings. In the following description of the various embodiments, like reference characters or numerals designate like or equivalent component parts throughout the several diagrams.

First Embodiment

A description will be given of an automatic engine control device according to a first embodiment of the present invention with reference to FIG. 1.

FIG. 1 is a block diagram showing an entire system structure of an automatic engine control device according to the present invention.

As shown in FIG. 1, the automatic engine control device has an internal combustion engine 10 (which will be referred to as the "engine 10"), an electric power generation device 20, a battery 30 such as a secondary battery, a current sensor 40, a voltage sensor 50, a starter 60 such as a starter motor, an engine control unit (ECU) 70, one or more electrical loads 80. FIG. 1 shows one electrical load 80 for brevity.

The engine 10 is mounted on a vehicle to serve as a driving power generator capable of supplying a driving torque to wheels of the vehicle and the electric power generation device 20. The electric power generation device 20 is comprised of an AC generator 21 and a regulator 22. The regulator 22 serves as a control circuit to control an output of the AC generator 21. A rotor in the AC generator 21 is engaged with a crank shaft of the engine 10 and rotates by a rotation power supplied from the engine 10 through the crank shaft. In other words, the AC generator 21 generates electric power while the crank shaft of the engine 10 is rotating.

The battery 30 is electrically connected to output terminals of the AC generator 21 in the electric power generation device 20. The battery 30 is electrically connected in parallel to the electrical load 80. The battery 30 is a rechargeable secondary battery such as lead-acid battery, nickel-metal hydride battery, lithium battery. etc. The present invention does not limit the type of the battery. Through the first to fifth embodiments according to the present invention, a lead-acid battery for vehicle is used as the battery 30.

The current sensor 40 detects a discharging current which flows from the battery 30, and a charging current which flows into the battery 30.

The voltage sensor 50 (which corresponds to the "voltage detection means") detects a terminal voltage of the battery 30.

The starter 60 is electrically connected in parallel to the battery 30. Specifically, one terminal of the starter 60 is electrically connected to one terminal as a positive electrode of the battery 30, and the other terminal of the starter 60 is electrically earthed, namely, electrically connected to the other terminal as a negative electrode of the battery 30.

The starter 60 drives by the electric power supplied from the battery 30. The driving period of time of the starter 60 is referred to as the "cranking period of time". Driving the starter 60 initiates the engine 10 to start.

As described above, one terminal of the starter 60 is electrically connected to the positive electrode of the battery 30. In the following explanation, the wiring between one terminal of the starter 60 and the positive electrode of the battery 30 is referred to as the "conductive connection line 61". That is, one terminal of the starter 60 is electrically connected to the positive electrode of the battery 30 through the conductive connection line 61.

The ECU 70 is composed mainly of a microcomputer and nonvolatile memories such as a backup RAM and an EEPROM. Hereinafter, such a backup RAM or an EEPROM will be referred to as the "memory unit".

The ECU 70 controls charging and discharging of the battery 30 based on output values, etc., transferred from the current sensor 40 and the voltage sensor 50.

The ECU 70 further control the operation of the starter 60 and the engine 10. In particular, the ECU 70 in the embodiments of the present invention performs the operation to control automatic stop and restart of the engine 10.

(General Explanation of a Voltage Change of the Battery 30)

Next, a description will now be given of a voltage change of the battery 30 with reference to FIG. 2 when the ECU 70 instructs the engine 10 to automatically stop, in other words, performs the engine idle stop (that is, idle reduction), and instructs the engine 10 to restart during the engine idle stop for the engine 10.

Figure 2:
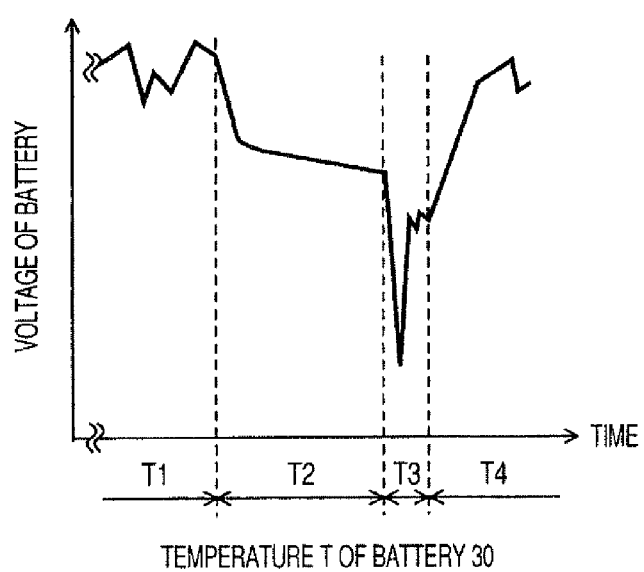
FIG. 2 is a view showing a voltage change of a battery mounted on a vehicle to the time elapse counted from a time to execute an engine idle stop after an engine drives to a time when the engine restarts.

FIG. 2 is a view showing a voltage change of the battery 30 mounted on the vehicle to the time elapse counted from a time to start the engine idle stop for the engine 10 after the engine 10 works to a time when the engine 10 restarts after the engine idle stop.

In FIG. 2, T1 designates the period to work the engine 10, T2 denotes the period to the engine idle stop, and T3 indicates the period to restart the engine 10.

As shown in the period T1 in FIG. 2, during the working of the engine 10, that is, while the vehicle equipped with the engine 10 is driving, or while the engine 10 is in idle state, the voltage of the battery 30 is changed according to the use of the electrical load 8, and an electric generation amount of the AC generator 21.

After this, when the ECU 70 instructs the engine 10 to be in idle stop state, as shown in the period T2, because the electrical load 80 uses the electric power supplied only from the battery 30, the voltage of the battery 30 rapidly drops. After this, the capacity of the battery 30 becomes somewhat stable, but the terminal of the battery 30 is gradually decreased.

As shown in the period T3, because a large amount of current is supplied from the battery 30 to the starter 60 when the engine 10 restarts, the voltage of the battery 30 rapidly and drastically drops. At this time, the starter 60 does not rotate. After this, the engine 10 starts to work after the voltage of the battery 30 is fluctuated, namely, increased and decreased when the starter 60 starts to rotate.

The period in which the starter 60 rotates is called to as the "cranking period".

After this, like the period T1 previously described, in the period T4 after the engine 10 starts to work, the voltage of the battery 30 is changed according to the use of the electrical load 80 and the electric generation amount of the AC generator 21.

In particular, the battery 30 has the minimum voltage (or the lowest voltage, hereinafter, will be referred to as the "minimum voltage") during the period T3 when the engine 10 restarts. Because it becomes difficult to restart the engine 10 when the voltage of the battery 30 is less than a predetermined voltage value, it is necessary for the battery 30 to keep its voltage of being not less than the predetermined voltage value.

Hereinafter, a description will now be given of the structure and operation to avoid this phenomenon, that is, avoid that the voltage of the battery 30 becomes less than the predetermined voltage value.

(Structure of the ECU 70)

Next, a description will now be given of the structure of the ECU 70 with reference to FIG. 3.

Figure 3:
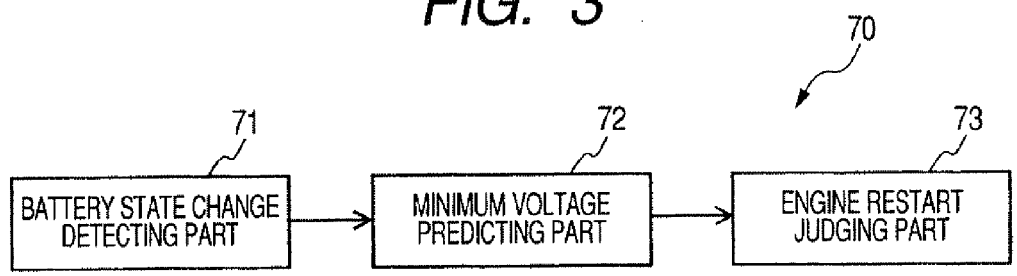
FIG. 3 is a block diagram showing functional blocks in an ECU 70 in the automatic engine control device shown in FIG. 1 according to a first embodiment of the present invention.

FIG. 3 is a block diagram showing functional blocks in the ECU 70 shown in FIG. 1 according to the first embodiment of the present invention.

As shown in FIG. 3, the ECU 70 is comprised mainly of a battery state change detection part 71, a minimum voltage predicting part 72, and an engine restart judging part 73.

The battery state change detection part 71 (which corresponds to the "battery state change detection means"). The battery state change detection part 71 detects a state change of the battery 30. Specifically, the battery state change detection part 71 detects a change of a SOC (State Of Charge as a residual capacity) of the battery 30 and a temperature change of the battery 30. In the first embodiment, the battery state change detection part 71 detects a state change from a time when an internal resistance value Rb of the battery 30 is previously calculated to a present time.

The minimum voltage predicting part 72 predicts a minimum voltage Vbtm2 of the battery 30 during a time period until the engine restart during the automatic engine stop. The minimum voltage predicting part 72 corresponds to the "minimum voltage prediction means". A concrete process of the minimum voltage predicting part 72 will be explained later in detail.

The engine restart judging part 73 judges whether the engine restart during the automatic engine stop mode is permitted or not based on the minimum voltage Vbtm2 which is predicted by the minimum voltage predicting part 72. The engine restart judging part 73 corresponds to the "restart permission judging means".

Specifically, the engine restart judging part 73 executes the engine restart when the predicted minimum voltage Vbtm2 of the battery 30 is lower than a predetermined voltage threshold value Th which is set in advance. In other words, the engine restart judging part 73 continues the engine idle stop of the engine 10, unless receiving the instruction transferred from the vehicle driver, during a period for the predicted minimum voltage Vbtm2 of the battery 30 to be not less than the predetermined thresh voltage Th.

(Explanation Regarding the Battery 30, the Starter 60, and the Closed Circuit 100 Formed by the Conductive Connection Line 61)

Figure 4:
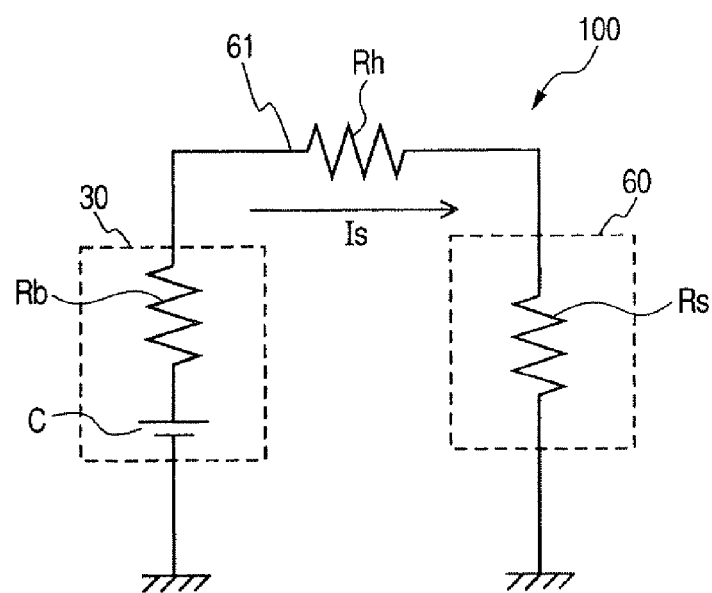
FIG. 4 is a schematic view showing a closed circuit in the automatic engine control device shown in FIG. 1.

As previously explained with FIG. 1, one terminal of the starter 60 is electrically connected to the positive electrode of the battery 30 through the conductive connection line 61. That is, as shown in FIG. 4, the starter 60, the battery 30, and the conductive connection line 61 form the closed circuit 100. In the battery 30, an electric power part C and an internal resistance are connected in series. Reference character "Rb" designates the value of the internal resistance in the battery 30.

(Hereinafter, it will be referred to as the "internal resistance value Rb".) As previously described, the internal resistance value Rb is changed according to the change of the SOC and the temperature of the battery 30.

The conductive connection line 61 contains a wiring resistance. The wiring resistance value is designated by reference character "Rh".

It is possible for the ECU 70 to recognize the starter 60 as a resistance before the starter 60 rotates. The internal resistance value of the starter 60 is referred by reference character "Rs". That is, the electric power source part C, the internal resistance Rb of the battery 30, the wiring resistance Rh of the conductive connection line 61, and the internal resistance Rs of the starter 60 are connected in series to form the closed circuit 100. A current flowing through the closed circuit 100 is referred by reference character "Is".

(Action of the Internal Resistance Value Rb of the Battery 30)

As previously described, the internal resistance Rb of the battery 30 is changed according to the SOC (State Of Charge) as a residual capacity of the battery 30 and the temperature T of the battery 30. This behavior of the battery 30 will be explained with reference to FIG. 5.

Figure 5A:
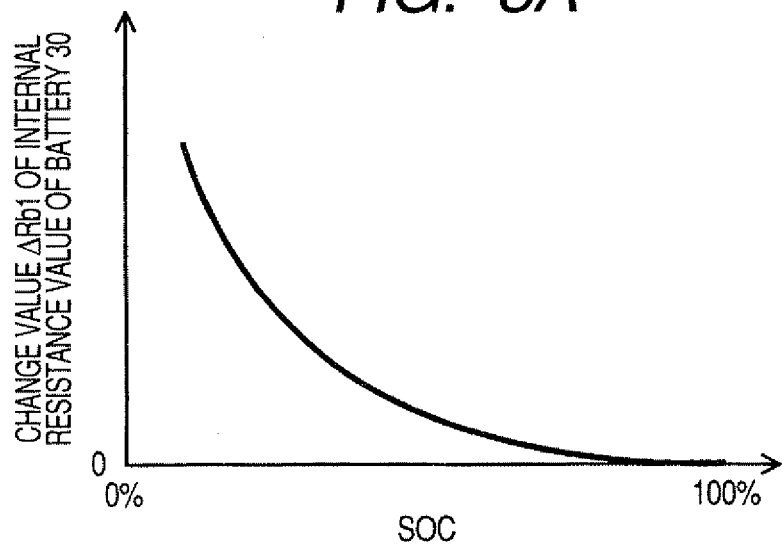
FIG. 5A is a view showing a map to be used by a battery state change detection part in the ECU 70 shown in FIG. 3, and this map shows a relationship between a state of charge (SOC) as a residual capacity of the battery and a change value $\Delta Rb1$ of an internal resistance value Rb in the battery.

FIG. 5A is a view showing a map to be used by the battery state change detection part 71 in the ECU 70 shown in FIG. 3. This map shows a relationship between the SOC as the residual capacity of the battery 30 and the change value $\Delta Rb1$ of the internal resistance value Rb in the battery 30.

As shown in FIG. 5A, the change value $\Delta Rb1$ of the internal resistance value Rb of the battery 30 gradually increases when the SOC of the battery 30 is change from 100% to 0% when the SOC of 100% of the battery 30 is standardized or becomes standards. That is, the more the SOC of the battery 30 decreases, the more the internal resistance value Rb of the battery 30 increases.

Figure 5B:
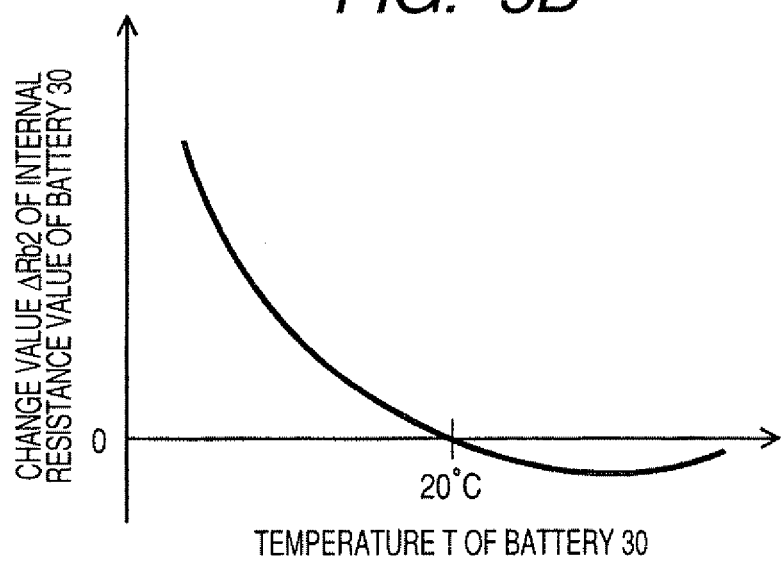
FIG. 5B is a view showing a map to be used by the battery state change detection part in the ECU 70 shown in FIG. 3, and this map shows a relationship between a temperature of the battery and a change value $\Delta Rb2$ of the internal resistance value Rb in the battery.

FIG. 5B is a view showing a map to be used by the battery state change detection part 71 in the ECU 70 shown in FIG. 3. This map shows a relationship between the temperature of the battery 30 and the change value $\Delta Rb2$ of the internal resistance value Rb in the battery 30.

As shown in FIG. 5B, when the internal resistance value Rb of the battery 30 at the temperature of 20° C. is standardized, the more the temperature T of the battery 30 becomes higher than 20° C., the more the change value $\Delta Rb2$ of the internal resistance value Rb of the battery 30 decreases. On the other hand, the more the temperature T of the battery 30 becomes lower than 20° C., the more the change value $\Delta Rb2$ of the internal resistance value Rb of the battery 30 increases.

That is, the internal resistance value Rb of the battery 30 increases according to decreasing the temperature T of the battery 30. In particular, when the battery 30 is at a high temperature (for example 70° C.), the more the temperature T of the battery 30 increases, the more the internal resistance value Rb of the battery 30 increases.

As described above, the internal resistance value Rb of the battery 30 is changed according to the SOC and the temperature T of the battery 30. In the first embodiment, the battery state change detection part 71 detects the SOC and the temperature T of the battery 30.

(Process by the Minimum Voltage Predicting Part 72)

Next, a description will now be given of the detailed process executed by the minimum voltage predicting part 72 with reference to FIGS. 6A, 6B, 7, 8, and 9.

Figure 6A:
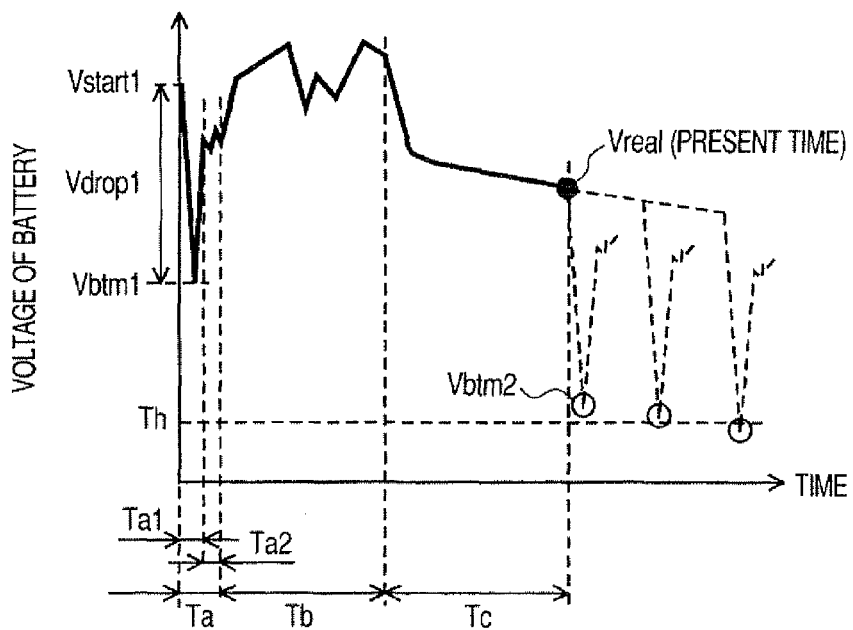
FIG. 6A is a view showing a voltage change of the battery to the time elapse during the engine idle stop after the engine starts.
Figure 6B:
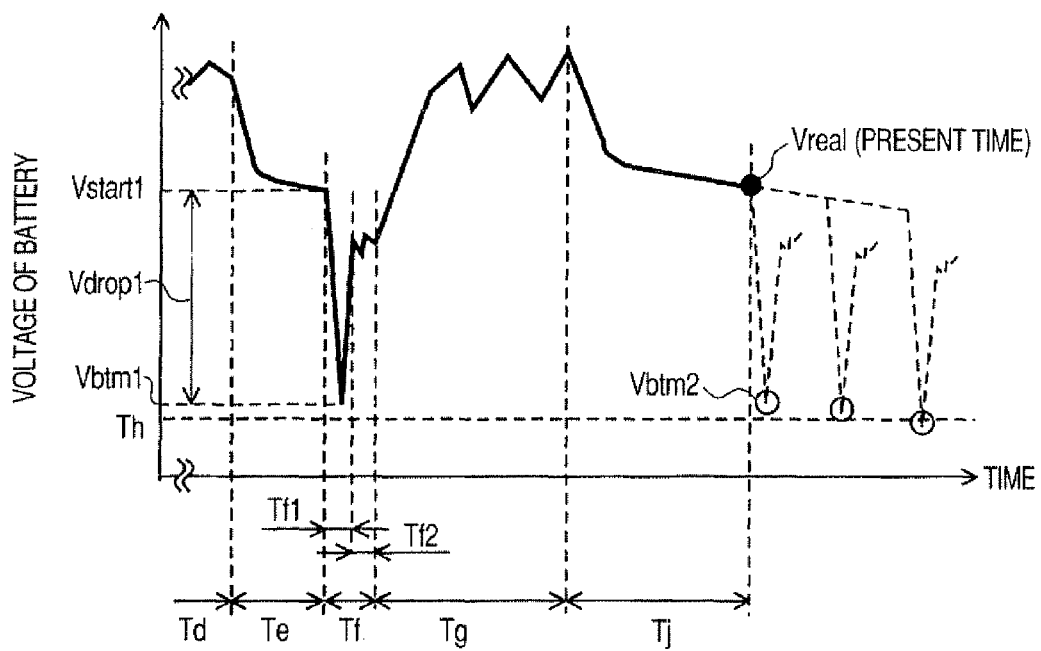
FIG. 6B is a view showing a voltage change of the battery to the time elapse during the engine idle stop at secondary time or more after the engine starts.

FIG. 6A is a view showing a voltage change of the battery 30 to the time elapse during the engine idle stop after the engine 10 starts. FIG. 6B is a view showing a voltage change of the battery 30 to the time elapse during the engine idle stop at secondary time or more after the engine 10 starts.

There are two patterns such as a primary pattern and a secondary pattern for the minimum voltage predicting part 72 to perform the process to predict the minimum voltage Vbtm2 of the battery. Each of the primary pattern and the secondary pattern will now be explained with reference to FIG. 6A and FIG. 6B.

As shown in FIG. 6A, the primary patterns indicates the case in which the ECU 70 performs the first engine idle stop in the engine 10 after the engine 10 starts to work at a first time. That is, the primary patterns indicates a timing whether or not the engine 10 starts to restart during the first engine idle stop. In FIG. 6A, the period Ta indicates a pre-start period of the engine 10. The period Tb denotes that the engine 10 is working. The period Tc denotes a previous period before the engine 10 starts to restart during the engine idle stop operation. The period Ta1 in the period Ta designates a period in which a momentary large discharging current flows from the battery 30 to the starter 60. The period Ta2 in the period Ta denotes a cranking period of the starter 60 in which the starter 60 works.

A description will now be given of the secondary pattern with reference to FIG. 6A. The secondary case indicates executing the engine idle stop at second time or more after the engine 10 has already restarted at least one time. That is, the secondary pattern indicates the case at the timing whether the engine 10 restarts or not during the secondary or more engine idle stop operation.

In FIG. 6B, the period Td indicates that the engine 10 is now working, the period Te denotes a period in the previous engine idle stop in the past before the engine 10 restarts, the period Tf (which corresponds to the "previous engine restart timing") indicates a previous engine restarting time of the engine 10, the period Tg designates the period in which the engine 10 is now working, and the period Tj indicates a period before the engine 10 restarts during the engine idle stop.

In the period Tf1 during the period Tf indicates a period in which a large discharging current instantly flows from the battery 30 to the starter 60. The period Tf2 indicates a cranking period in which the starter 60 is rotating.

In the following explanation, the "start" contains both meanings, the "initial start" and the "restart". The "initial start" only means that the engine 10 starts at first time. The "restart" indicates that the engine 10 restarts.

A description will now be given of the process performed by the minimum voltage predicting part 72 with reference to FIG. 7, FIG. 8, and FIG. 90.

Figure 7:
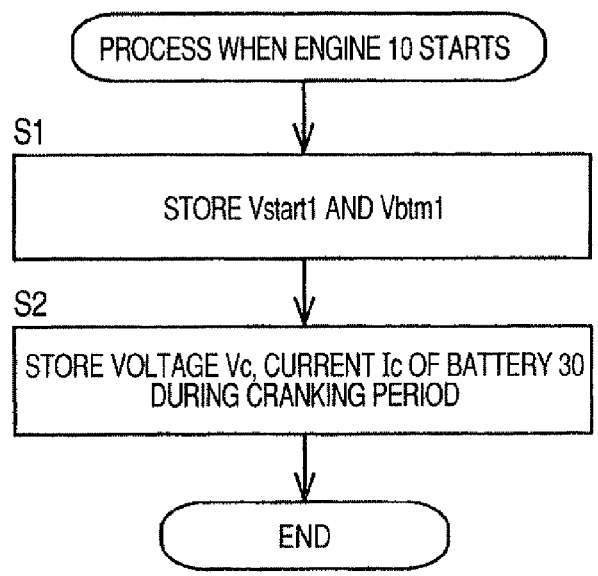
FIG. 7 is a flow chart showing a process when the engine restarts performed by a minimum voltage predicting part in the ECU 70.

FIG. 7 is a flow chart showing a process when the engine 10 restarts performed by the minimum voltage predicting part 72 in the ECU 70.

The minimum voltage predicting part 72 performs the process shown in FIG. 7 when the engine 10 starts to work.

In the flow chart shown in FIG. 7, the ECU 70 stores the voltage Vstart1 (see FIG. 6A and FIG. 6B) of the battery 30 at the beginning time of both the periods Ta and Tf immediately before the engine start into the nonvolatile memories such as a backup RAM and an EEPROM (step S1).

The ECU 70 further stores into the memory unit the minimum voltage Vbtm1 of the battery 30 (see FIG. 6A and FIG. 6B) immediately after the engine 10 starts to work (step S1).

Hereinafter, the voltage Vbtm1 will be referred to as the "minimum voltage Vbtm1 of the battery 30 at the previous time". The process to store the "minimum voltage Vbtm1 of the battery 30 in the past" corresponds to the "past minimum voltage obtaining means".

The ECU 70 further stores into the memory unit a voltage Vc and a maximum discharging current Ic of the battery 30 to be supplied from the battery 30 to the starter 60 during the cranking periods Ta2 and Tf2 (step S2). The voltage Vc and the maximum discharging current Ic during the cranking periods Ta2 and Tf2 are stored into the memory unit every sampling period. The ECU 70 then completes the process, performed by the minimum voltage predicting part 72, at the starting time of the engine 10.

Figure 8:
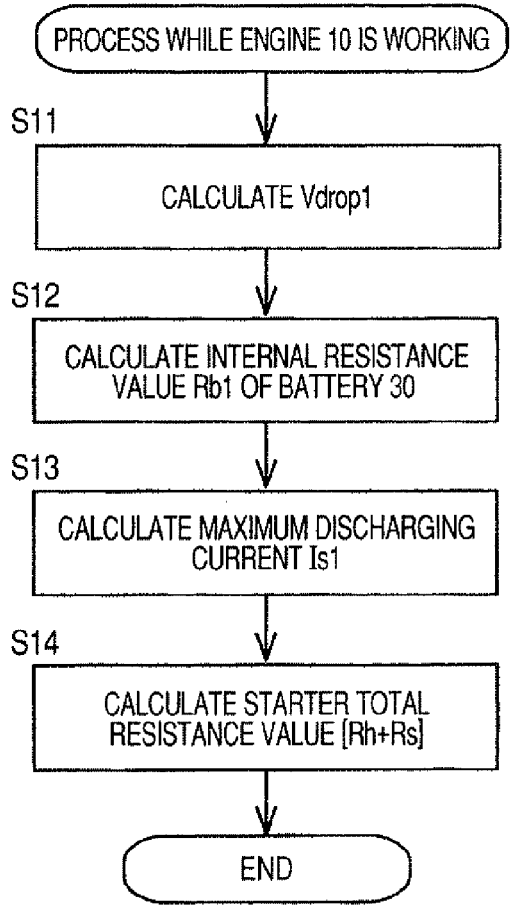
FIG. 8 is a flow chart showing a process when the engine works (in the idle state and the driving state) performed by the minimum voltage predicting part in the ECU 70.

Next, the minimum voltage predicting part 72 performs the process shown in FIG. 8 during the working period of the engine 10. The minimum voltage predicting part 72 performs this process during the period Tb shown in FIG. 6A and during the period Tg shown in FIG. 6B.

FIG. 8 is a flow chart showing the process when the engine works (during the idle state and the driving state) performed by the minimum voltage predicting part 72 in the ECU 70.

The minimum voltage predicting part 72 calculates a difference between the voltage Vstart1 of the battery 30 and the minimum voltage Vbtm1 of the battery 30 at the previous time, and a voltage drop amount Vdrop1 of the battery 30 based on this difference (step S11). That is, this voltage drop amount Vdrop1 of the battery 30 indicates the voltage drop amount during the period counted from a time immediately before the engine 10 starts to a time when the voltage of the battery 30 has a minimum voltage during the starting operation of the engine 10. This calculation process corresponds to the "past voltage drop obtaining means".

After this, the minimum voltage predicting part 72 calculates an internal resistance Tb1 of the battery 30 at the starting time of the engine 10 at the previous time based on the voltage Vc and the maximum discharging current Ic of the battery 30 during the cranking period which are stored in the memory unit in step S2 when the engine 10 restarts (step S12). This calculation process corresponds to the "past battery internal resistance value obtaining means". The internal resistance value Rb1 of the battery 30 can be calculated by the conventional calculation process, for example, which is disclosed in Japanese patent laid open publications No. 2005-274214 and No. 2007-223530. Therefore a detailed explanation of calculating the internal resistance value of the battery 30 is omitted here for brevity.

The minimum voltage predicting part 72 in the ECU 70 calculates a maximum discharging current Is1 based on the voltage drop value Vdrop1 and the internal resistance value Rb1 of the battery 30, which have been already calculated, by using the following equation (1) (step S13). This calculation process corresponds to the "past maximum discharging current obtaining means". The calculated maximum discharging current Is1 becomes a discharging current of the battery 30 at the time when the battery 30 has the minimum voltage Vbtm1 during the engine start process at previous time.

$$Is1 = Vdrop1/Rb1 \quad (1).$$

Because the maximum discharging current Is1 exceeds a detectable current range of the current sensor 40, the minimum voltage predicting part 72 in the ECU 70 according to the first embodiment calculates and uses the maximum discharging current Is1. When the current sensor 40 can detect a current within the range including the maximum discharging current Is1, it is possible for the current sensor 40 to directly detect the maximum discharging current Is1.

After this, the minimum voltage predicting part 72 calculates a total of the wiring resistance value Rh of the conductive connection line 61 and the internal resistance value Rs of the starter 60 (step S14). This total will be referred to as the "total of resistance value of the starter". Specifically, the minimum voltage predicting part 72 calculates the total [Rh+Rs] of resistance value of the starter by using the following equation (2) based on the minimum voltage Vbtm1 at the engine start time at the previous time and the maximum discharging current Is1 calculated in step S13. This calculation process corresponds to the "starter total resistance calculating means. The ECU 70 completes the minimum voltage predicting process performed by the minimum voltage predicting part 72 during the engine working period.

$$[Rh+Rs] = Vbtm1/Is1 \quad (2).$$

Figure 9:
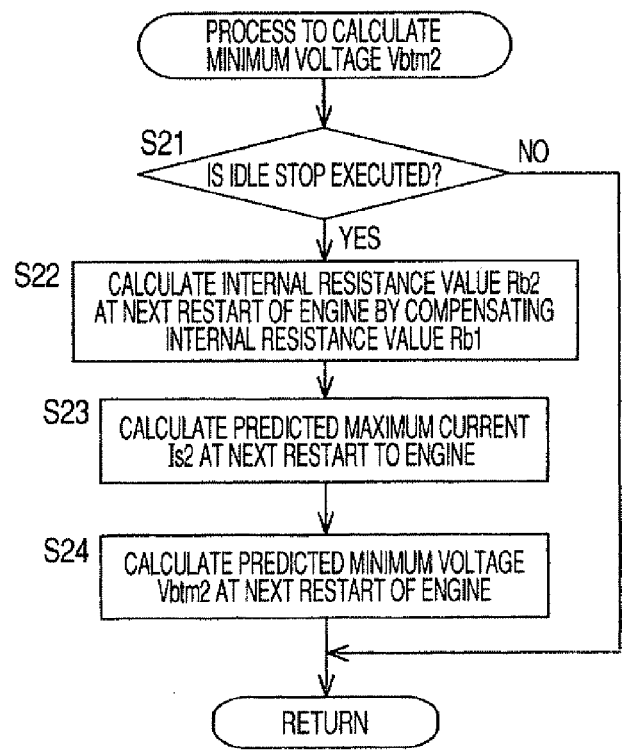
FIG. 9 is a flow chart showing a process of calculating a predicted value of the minimum voltage Vbmt2 performed by the minimum voltage predicting part in the ECU 70.

Next, the minimum voltage predicting part 72 performs the process shown in FIG. 9 during the engine idle stop.

FIG. 9 is a flow chart showing a process of calculating a predicted value of the minimum voltage Vbmt2 performed by the minimum voltage predicting part 72 in the ECU 70.

The process shown in FIG. 9 is executed during the period Tc shown in FIG. 6A and during the period Tj shown in FIG. 6B. In step S21, the minimum voltage predicting part 72 judges whether or not the engine 10 is in the engine idle stop. When the judgment result indicates that the engine 10 is not in the engine idle stop state ("No" in step S21), the operation to calculate the minimum voltage value Vbotm2 of the battery 30 is completed.

On the other hand, when the judgment result indicates that the engine 10 is in the engine idle stop ("Yes" in step S21), the operation flow progresses to step S22. In step S22, the minimum voltage predicting part 72 compensates the internal resistance value Rb1 of the battery 30 calculated at the previous time in order to obtain the internal resistance value Rb2 of the battery 30 at the present time. Specifically, the internal resistance value Rb1 of the battery 30 at the previous time is compensated based on the SOC as a residual capacity and the temperature of the battery 30 at the present time, and the internal resistance value Rb1 of the battery 30 at the previous time by using the following equation (3) in order to obtain the internal resistance value Rb2 of the battery 30 at the present time $$Rb2 = Rb1 \times f(\Delta SOC, \Delta T) \quad (3),$$

where f(a, b) is a function regarding parameters "a" and "b", $\Delta SOC$ is a change value of the SOC, and $\Delta T$ is a temperature change.

For example, when the value SOC of the battery 30 at the present time is decreased to the SOC of the battery 30 when the internal resistance value Rb1 of the battery 30 is calculated, the minimum voltage predicting part 72 compensates the internal resistance value Rb2 of the battery 30 at the present time so that the internal resistance value Rb1 of the battery 30 at the present time becomes larger than the internal resistance value Rb1 of the battery 30 at the previous time.

In addition, when the temperature T of the battery 30 at the present time is higher than that of the battery 30 at the previous time when the internal resistance value Rb1 of the battery 30 is calculated, the minimum voltage predicting part 72 compensates the internal resistance value Rb2 of the battery 30 so that the internal resistance value Rb2 becomes smaller than the internal resistance value Rb1 of the battery 30, for example.

Strictly speaking, the internal resistance value Rb2 of the battery 30 is changed according to the temperature T of the battery 30. This process to calculate the internal resistance value Rb1 of the battery 30 at the present time corresponds to the "present battery internal resistance value obtaining means".

After this, the minimum voltage predicting part 72 calculates a predicted value of a maximum discharging current Is2 to be supplied from the battery 30 to the starter 60 during the period until the next engine restart step (step S23). Specifically, the minimum voltage predicting part 72 calculates the next maximum discharging current Is2 based on the voltage Vreal of the battery 30 at the present time detected by the voltage sensor 50, the internal resistance value Rb1 of the battery 30 at the present time predicted in step S22, and the total resistance value [Rh+Rs] of the starter 60 by using the following equation (4). The following equation (4) can be changed to the following equation (5) based on the equation (2). The process to predict the maximum discharging current Is2 corresponds to the "maximum discharging current predicting means".

$$Is2 = Vreal1/(Rb2+[Rh+Rs]) \quad (4), \text{and}$$

$$Is2 = Vreal1/(Rb2+Vbtm1/Is1) \quad (5).$$

After this, the minimum voltage predicting part 72 calculates the minimum voltage Vbtm2 of the battery 30 at the next restart of the engine (step S24). Specifically, the minimum voltage predicting part 72 calculates the minimum voltage Vbtm2 of the battery 30 based on the voltage Vreal of the battery 30 at the present time detected by the voltage sensor 50, the internal resistance value Rb2 of the battery 30 at the present time predicted at step S22, and the maximum discharging current Is2 predicted in step S23 by using the following equation (6). This process to calculate the minimum voltage Vbtm2 of the battery 30 corresponds to the "minimum voltage predicting means".

$$Vbtm2 = Vreal1 - Rb2 \times Is2 \quad (6).$$

As described above, it is possible for the minimum voltage predicting part 72 to calculate the minimum voltage Vbtm2 of the battery 30 at the timing of the next restart of the engine.

The engine restart judging part 73 in the ECU 70 judges based on the predicted minimum voltage Vbtm2 of the battery 30 whether the engine restart can be permitted or the engine idle stop process is continued. This judgment process will now be explained with reference to the flow chart shown in FIG. 10.

Figure 10:
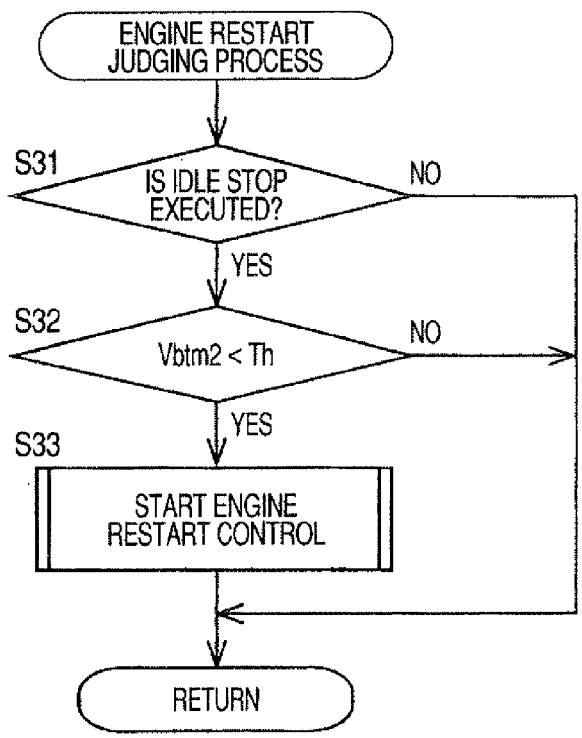
FIG. 10 is a flow chart showing a process of judging whether the engine restart is permitted performed by an engine restart judging part in the ECU 70.

FIG. 10 is a flow chart showing the process to judge whether the engine restart is permitted. The engine restart judging part 73 in the ECU 70 executes this judgment process.

The engine restart judging part 73 judges whether or not the engine 10 is in the engine idle stop state (step S31). When the judgment result in step S31 indicates that the engine 10 is not in the engine idle stop state ("No" in step S31), the engine restart judging part 73 completes the process shown in FIG. 10.

On the other hand, the judgment result indicates that the engine 10 is in the engine idle stop state ("Yes" in step S31), the engine restart judging part 73 judges whether or not the predicted minimum voltage Vbtm2 of the battery 30 is less than a predetermined threshold value Th (step S32).

When the judgment result in step S32 indicates that the predicted minimum voltage Vbtm2 of the battery 30 is less than the predetermined threshold value Th ("Yes" in step S32), the engine restart judging part 73 executes the engine restart process (step S33).

On the other hand, when the judgment result in step S32 indicates that the predicted minimum voltage Vbtm2 of the battery 30 is not less than the predetermined threshold value Th ("No" in step S32), the engine restart judging part 73 completes the process shown in FIG. 10. That is, when the predicted minimum voltage Vbtm2 of the battery 30 is not less than the predetermined threshold value Th, the ECU 70 continues to execute the engine idle stop of the engine 10.

(Effects)

The automatic engine control device described above in detail according to the first embodiment of the present invention has the following effects. The automatic engine control device predicts the maximum discharging current Is2 to be supplied form the battery 30 to the starter 60 at the next engine restart process based on the wiring resistance value Rh of the conductive connection line 61 and the internal resistance value Rs of the starter 60. Accordingly, when the engine 10 is in the automatic engine stop mode (in the engine idle stop state) at the present time, it is possible to calculate the maximum discharging current Is2 with high accuracy to be supplied from the battery 30 to the starter 60 at the next engine restart process.

It is thereby possible for the engine restart judging part 73 to predict the minimum voltage Vbtm2 of the battery 30 with high accuracy. That is, it is possible to prevent the voltage of the battery 30 from becoming less than the predetermined voltage threshold value Th. This can guarantee the engine restart operation with high reliability.

The engine restart judging part 73 calculates the total resistance value [Rh+Rs] of the starter 60 based on the voltage Vc of the battery 30 detected when the starter 60 does not rotate and the maximum discharging current Ic to be supplied from the battery 30 to the starter 60 which are detected immediately after the voltage is supplied to the starter 60.

The time when the starter 60 does not rotate indicates the time when the starter 60 does not generate electric power. That is, the engine restart judging part 73 detects and uses the voltage Vc of the battery 30 and the maximum discharging current Ic to be supplied from the battery 30 to the starter 60 during the period when the starter 60 does not generate any back electric power. Accordingly, it is possible to easily calculate the total resistance value [Rh+Rs] of the starter 60 based on Ohm's law. As a result, it is possible to calculate the voltage drop value Vdrop1 of the battery 30 with high accuracy.

It is possible for the automatic engine control device according to the first embodiment to calculate the total resistance value [Rh+Rs] of the starter 60 without using any voltage sensor and current sensor. That is, it is possible to predict the minimum voltage Vbtm2 of the battery 30 when the engine 10 restarts with low cost.

In the automatic engine control device according to the first embodiment of the present invention, the engine restart judging part 73 calculates the maximum discharging current Is1 based on the internal resistance value Rb1 of the battery 30 and the voltage drop value Vdrop1 of the battery 30 in the past. That is, the engine restart judging part 73 does not directly calculates the maximum discharging current Is1. Accordingly, it is possible to calculate the maximum discharging current Is1 of the battery 30 without using any current sensor 40 having a very wide detection range. In other words, it is possible for the automatic engine control device according to the first embodiment to predict the minimum voltage Vbtm2 of the battery 30 with high accuracy when the engine 10 restarts.

In addition, the automatic engine control device according to the first embodiment uses the data (recent data) obtained when the engine 10 starts at the previous time in order to calculate the internal resistance value Rb1 of the battery 30 and the total resistance value [Rh+Rs] of the starter 60. Because the recent data are very close to the current condition of the battery 30 and the other devices in the vehicle, it is possible to predict the minimum voltage Vbtm2 of the battery 30 with high accuracy.

Second Embodiment

A description will be given of the automatic engine control device according to the second embodiment with reference to FIG. 11.

Figure 11:
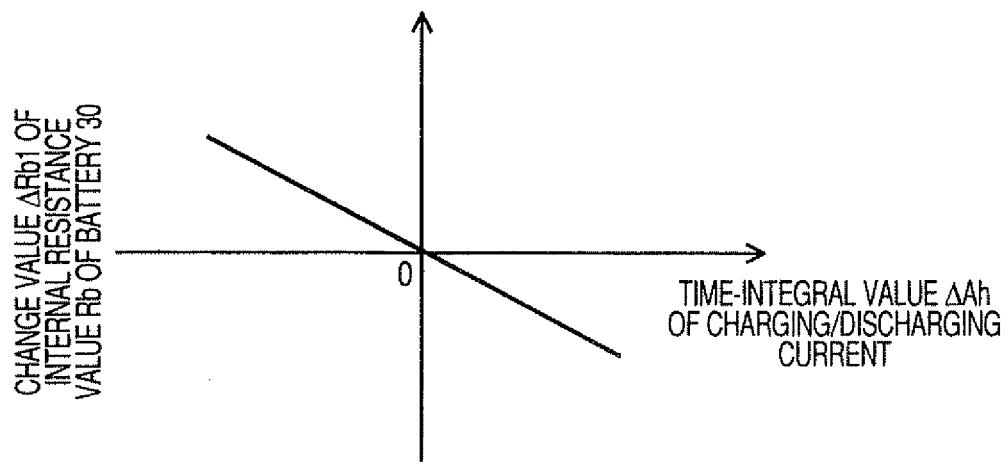
FIG. 11 is a view showing a map to be used by the battery state change detection part in the ECU 70, and this map shows a relationship between a time integrated value $\Delta Ah$ of a charge/discharge current of the battery and the internal resistance value Rb of the battery according to a second embodiment of the present invention.

FIG. 11 is a view showing a map to be used by the battery state change detection part 71 in the ECU 70. This map shows a relationship between a time-integrated value ΔAh of a charge/discharge current of the battery 30 and the internal resistance value Rb of the battery 30 according to the second embodiment of the present invention.

By the way, the battery state change detection part 71 in the ECU 70 of the automatic engine control device according to the first embodiment detects the change of SOC and the change of temperature of the battery 30. The minimum voltage predicting part 72 calculates the internal resistance value Rb2 of the battery 30 at the present time based on the change of the SOC and the change of the temperature of the battery 30.

As shown in FIG. 11, the internal resistance value Rb of the battery is changed according to a time-integrated value ΔAh of the charging/discharging current of the battery 30 during the period counted to the present time from a time when the internal resistance value Rb1 of the battery 30 is calculated at the previous engine start.

Therefore the automatic engine control device according to the second embodiment uses the SOC of the battery 30 which is also used in the first embodiment instead of the time-integrated value ΔAh of the charging/discharging current of the battery 30.

That is, the battery state change detection part 71 calculates the time-integrated value ΔAh of the charging/discharging current of the battery 30, and also detects the temperature T of the battery 30. In the process in step S22, minimum voltage predicting part 72 compensates the internal resistance value Rb1 of the battery 30 obtained in the previous time based on the time-integrated value ΔAh of the charging/discharging current of the battery 30 and the temperature T of the battery 30, and calculates the internal resistance value Rb2 of the battery 30 at the present time based on the compensated internal resistance value R131 of the battery 30.

Third Embodiment

A description will be given of the automatic engine control device according to the third embodiment of the present invention with reference to FIG. 12.

Figure 12:
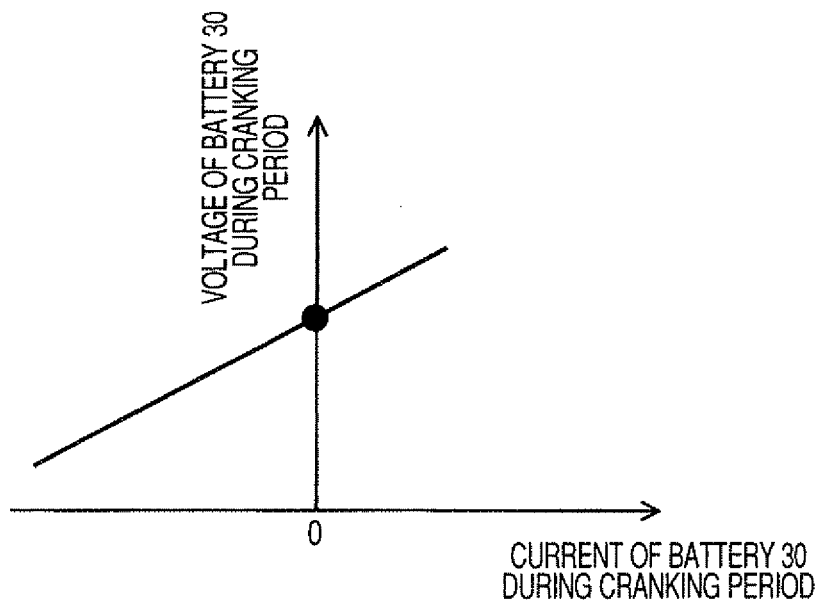
FIG. 12 is a view showing a relationship between a voltage and a current of the battery during a cranking period according to a third embodiment of the present invention.

FIG. 12 is a view showing a relationship between a voltage and a current of the battery 30 during the cranking period according to the third embodiment of the present invention.

The first embodiment uses the premise that the automatic engine control device is able to detect the voltage Vstart1 of the battery 30 at the time immediately after the engine 10 starts, that is, at the timing to start the period Ta shown in FIG. 6A. In addition, the first embodiment uses another premise that the automatic engine control device detects the minimum voltage Vbtm1 of the battery 30 immediately after the initial start of the engine.

However, there is a case where the starter 60 drives the engine 10 before the ECU 70 reaches a stable state in operation when the vehicle driver turns on the ignition key of the vehicle in order to initially start the engine 10. In this case, it is difficult for the ECU 70 to detect the voltage Vstart1 and the minimum voltage Vbtm1 of the battery 30.

When the ECU 70 does not obtain the voltage Vstart1 and the minimum voltage Vbtm1 of the battery 30 at the timing when the engine 10 initially starts, it becomes difficult for the ECU 70 to execute the engine idle stop process for the engine 10. Accordingly, when the ECU 70 cannot obtain the voltage Vstart1 of the battery 30 at the timing immediately before the engine 10 initially starts and the minimum voltage Vbtm1 of the battery 30 at the timing to initially start the engine 10, the ECU 70 uses a predetermined constant value as the total resistance value [Rh+Rs]. This predetermined constant value is set as a value corresponding to the temperature T in advance into the memory unit in the ECU 70. This predetermined constant value is set within an adequate safety range to the change in consideration to environmental condition and metal deterioration condition. It is thereby possible to execute the engine idle stop process of the engine 10 with high reliability even if the ECU 70 cannot detect the voltage Vstart1 and the minimum voltage Vbtm1 of the battery 30 when the engine 10 initially starts.

When the engine 10 initially starts by the vehicle driver's rapid operation to turn on the ignition key of the vehicle, although the ECU 70 cannot detect the voltage Vstart1 of the battery 30 at the timing immediately before the engine 10 initially starts, there is a case where the ECU 70 detects the minimum voltage Vbtm1 of the battery 30 immediately after the engine 10 initially starts. In this case, the ECU 70 estimates the total resistance value [Rh+Rs] of the starter 60 based on the detected minimum voltage Vbtm1 of the battery 30.

Specifically, the ECU 70 calculates the internal resistance value Rb1 of the battery 30 during the cranking period when the engine 10 initially starts. This internal resistance value Rb1 of the battery 30 is obtained from a slope of a line which is obtained by a linear approximation based on the current and voltage of the battery 30 during the cranking period.

As previously described in the explanation of the first embodiment, the internal resistance value Rb1 of the battery 30 can be calculated by the conventional method disclosed in Japanese patent laid open publications No. 2005-274214 and No. JP 2007-223530.

FIG. 12 shows a graph of a line which is obtained by linear approximation based on the current and voltage of the battery 30 during the cranking period during the cranking period. In FIG. 12, horizontal axis indicates the current of the battery, and the vertical axis indicates the voltage of the battery 30.

In FIG. 12, the voltage, when the linear approximation crosses the current of zero, indicates a pseudo opening voltage of the battery 30. This pseudo opening voltage is used as the voltage Vstart1 of the battery immediately before the engine 10 initially starts. Because it is possible to estimate the voltage Vstart1 of the battery 30 immediately before the engine 10 initially starts, it is then possible to calculate the total resistance value [Rh+Rs] of the starter 60 by the procedure which is previously explained in step S23 and step S24.

As described above, in a case where the ECU 70 cannot detect the voltage Vstart1 of the battery 30 immediately before the initial start of the engine, but the ECU 70 can detect the minimum voltage Vbtm1 of the battery 30 at the timing to drive the starter 60, it is possible for the ECU 70 to calculate a more optimum sum resistance value [Rh+Rs] of the starter 60.

Fourth Embodiment

A description will be given of the automatic engine control device according to the fourth embodiment of the present invention with reference to FIG. 13.

Figure 13:
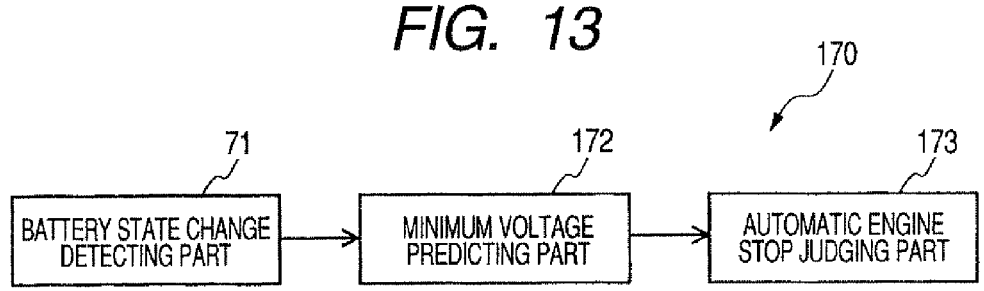
FIG. 13 is a block diagram showing functional blocks in an ECU 170 according to a fourth embodiment of the present invention.

FIG. 13 is a block diagram showing functional blocks in an ECU 170 of the automatic engine control device according to the fourth embodiment of the present invention.

The automatic engine control device according to the fourth embodiment judges whether or not the execution of engine idle stop is permitted when the engine 10 is working and the AC generator 21 is stopped.

A description will now be given of the ECU 170 in the automatic engine control device according to the fourth embodiment with reference to FIG. 13. In the structure of the automatic engine control device shown in FIG. 1, the fourth embodiment uses the ECU 170 instead of the ECU 70.

The same components between the fourth embodiment and the first embodiment are referred with the same reference numbers, and the explanation for the same components is omitted here for brevity.

The ECU 170 has the battery state change detection part 71, an minimum voltage predicting part 172, and an automatic engine stop judging part 173. This minimum voltage predicting part 172 corresponds to the "minimum voltage predicting means". The minimum voltage predicting part 172 executes the engine idle stop during a constant period Tja when the engine 10 is working and the AC generator 21 is stopped, and predicts a minimum voltage Vbtm2 of the battery 30 until the engine 10 restarts.

A description will now be given of the process to calculate the minimum voltage Vbtm2 of the battery 30 with reference to FIG. 14 and FIG. 15.

Figure 14:
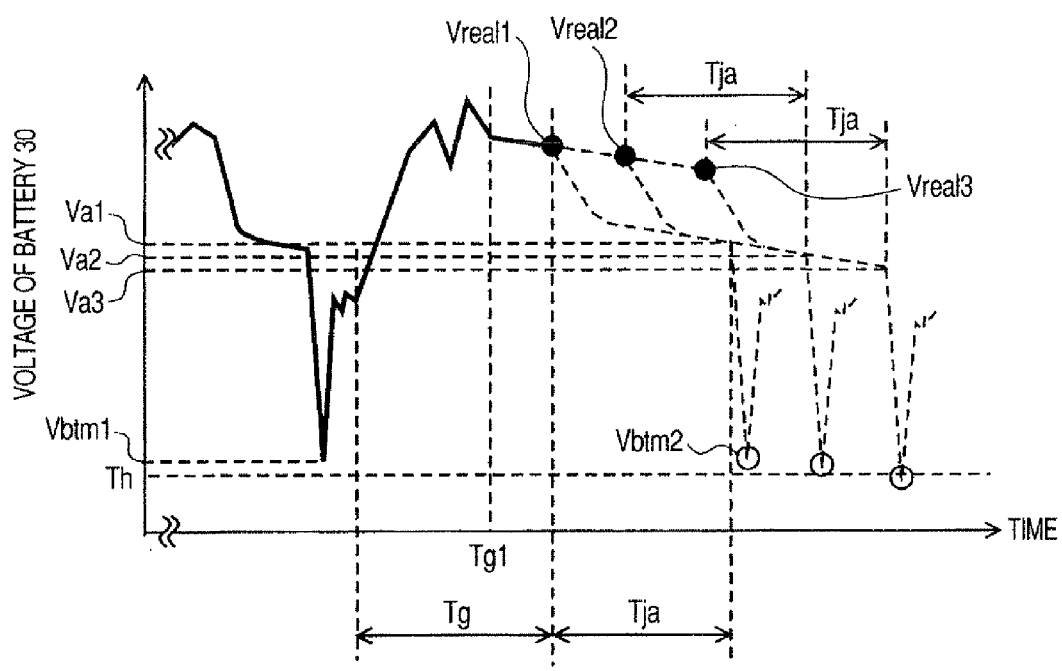
FIG. 14 is a view showing a voltage change of the battery to the time elapse during the engine idle stop after the engine works according to the fourth embodiment of the present invention.
Figure 15:
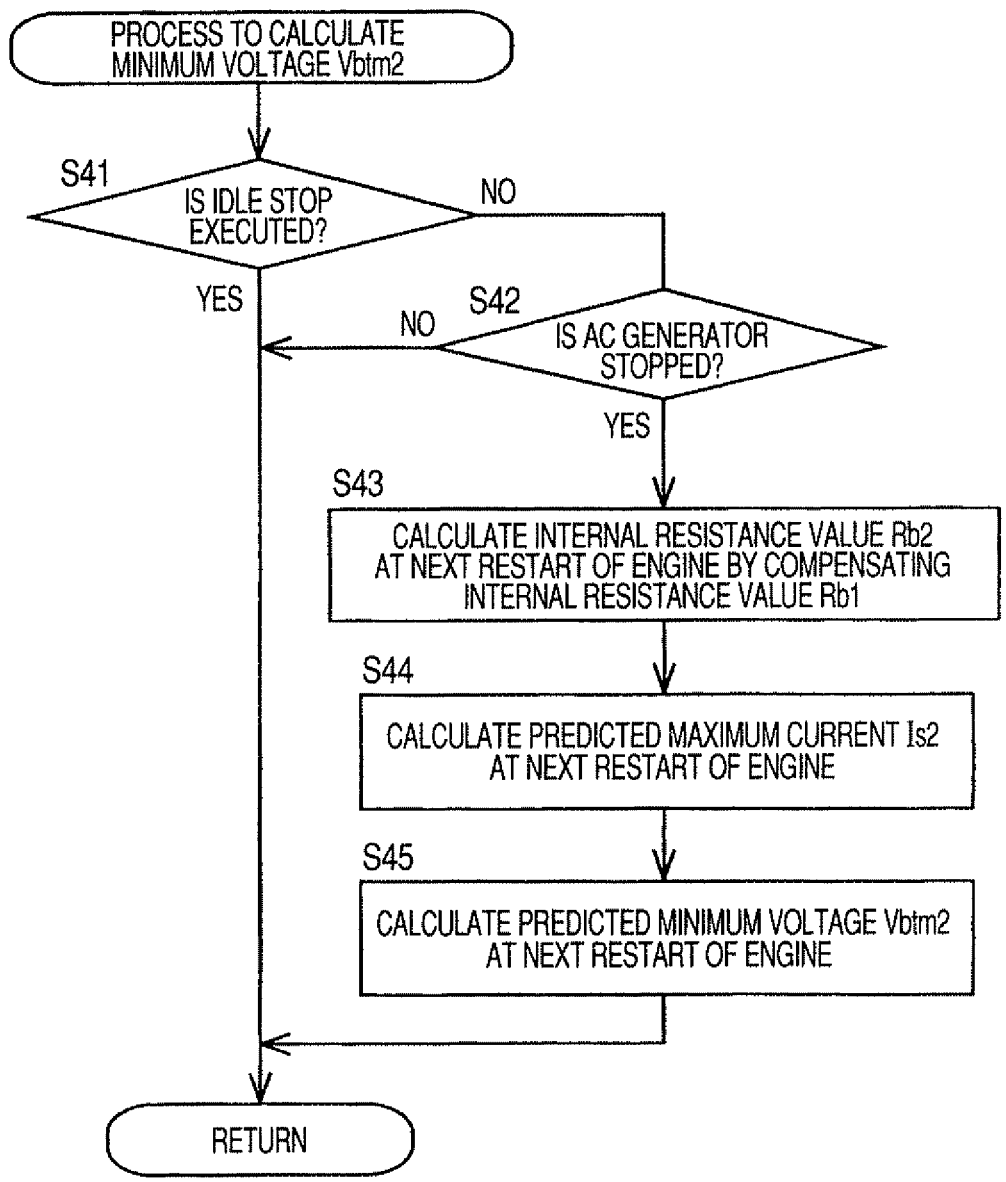
FIG. 15 is a flow chart showing a process of calculating a predicted value of the minimum voltage Vbmt2 performed by a minimum voltage predicting part in the ECU 170 according to the fourth embodiment of the present invention.

FIG. 14 is a view showing a voltage change of the battery 30 to the time elapse during the engine idle stop in the engine after the engine works according to the fourth embodiment of the present invention;

FIG. 15 is a flow chart showing a process of calculating a predicted value of the minimum voltage Vbmt2 of the battery 30 performed by a minimum voltage predicting part 172 in the ECU 170 according to the fourth embodiment of the present invention;

As shown in FIG. 15, the minimum voltage predicting part 172 in the ECU 170 judges whether or not the engine 10 is in the engine idle stop state (step S41). When the judgment result indicates that the engine 10 is in the engine idle stop state ("Yes" in step S41), the minimum voltage predicting part 172 in the ECU 170 completes the process shown in FIG. 15.

On the other hand, the judgment result indicates that the engine 10 is not in the engine idle stop state ("No" in step S41), the minimum voltage predicting part 172 in the ECU 170 further judges whether or not the AC generator 21 is now stopped or not (step S42). When the judgment result indicate that the AC generator is now working ("No" in step S42), the minimum voltage predicting part 172 completes the process shown in FIG. 15.

When the judgment result indicates that the AC generator 21 is now stopped ("Yes" in step S42), the minimum voltage predicting part 172 in the ECU 170 compensates the internal resistance value Rb1 of the battery 30 which has been calculated in step S12 at the previous time, and calculates the internal resistance value Rb2 of the battery 30 at the present time based on the compensated internal resistance value Rb1 (step S43).

Specifically, the minimum voltage predicting part 172 in the ECU 170 compensates the internal resistance value Rb1 of the battery 30 based on the SOC and the temperature T of the battery 30 at the present time, and the internal resistance value Rb1 of the battery 30 obtained in the previous time by using the equation (3) in order to calculate the internal resistance value Rb2 of the battery 30 at the present time.

In FIG. 4, a case where the engine idle stop is not executed and the AC generator 21 is stopped indicates the period after the time Tg1 during the period Tg in which the engine 10 is working.

The minimum voltage predicting part 172 in the ECU 170 predicts the maximum discharging current Is2 to be supplied from the battery 30 to the starter 60 until the next restart of the engine when the engine idle stop is continued for a constant period Tja (step S44). Specifically, the minimum voltage predicting part 172 in the ECU 170 estimates the voltages Va1, Va2, and Va3 of the battery 30 when the engine idle stop is executed for the constant period Tja based on the voltages Vreal1, Vreal2, and Vreal3 (shown in FIG. 14) at the present time detected by the current sensor 50.

The minimum voltage predicting part 172 in the ECU 170 calculates the next maximum discharging current Is2 based on the voltages Va1, Va2, and Va3 of the battery 30 when the engine idle stop is executed for the constant period Tja, the internal resistance value Rb2 of the battery 30 at the present time predicted in step S43, and the total resistance value [Rh+Rs] of the starter 60 by using the equation (4) (previously described).

After this, the minimum voltage predicting part 172 in the ECU 170 predicts the minimum voltage Vbtm2 of the battery 30 at the next restart of the engine when the engine idle stop is executed for the constant period Tja (step S45).

Specifically, the minimum voltage predicting part 172 in the ECU 170 calculates the minimum voltage Vbtm2 of the battery 30 based on the voltages Va1, Va2, and Va3 of the battery 30 when the engine idle stop is executed for the constant period Tja, the internal resistance value Rb2 of the battery 30 at the present time predicted in step S43, and the maximum discharging current Is2 predicted in step S44 by using the equation (6) (previously described). Those processes are repeated. It is thereby possible for the minimum voltage predicting part 172 in the minimum voltage predicting part 172 to calculate the minimum voltage Vbtm2 of the battery 30 at the next restart of the engine when the engine idle stop is executed for the constant period Tja of time.

The automatic engine stop judging part 173 judges whether the execution of engine idle stop is permitted or not based on the minimum voltage Vbtm2 of the battery 30 predicted by the minimum voltage predicting part 172. This automatic engine stop judging part 173 corresponds to the "automatic engine stop judging means".

Specifically, the automatic engine stop judging part 173 executes the engine idle stop when the predicted minimum voltage Vbtm2 of the battery 30 is not less than a predetermined threshold value Th when the engine 10 is working and the AC generator 21 is stopped.

That is, the automatic engine stop judging part 173 judges whether the execution of engine idle stop is permitted or the working of the engine 10 is continued based on the predicted minimum voltage Vbtm2 of the battery 30. This judgment will now be explained in detail with reference to FIG. 16.

Figure 16:
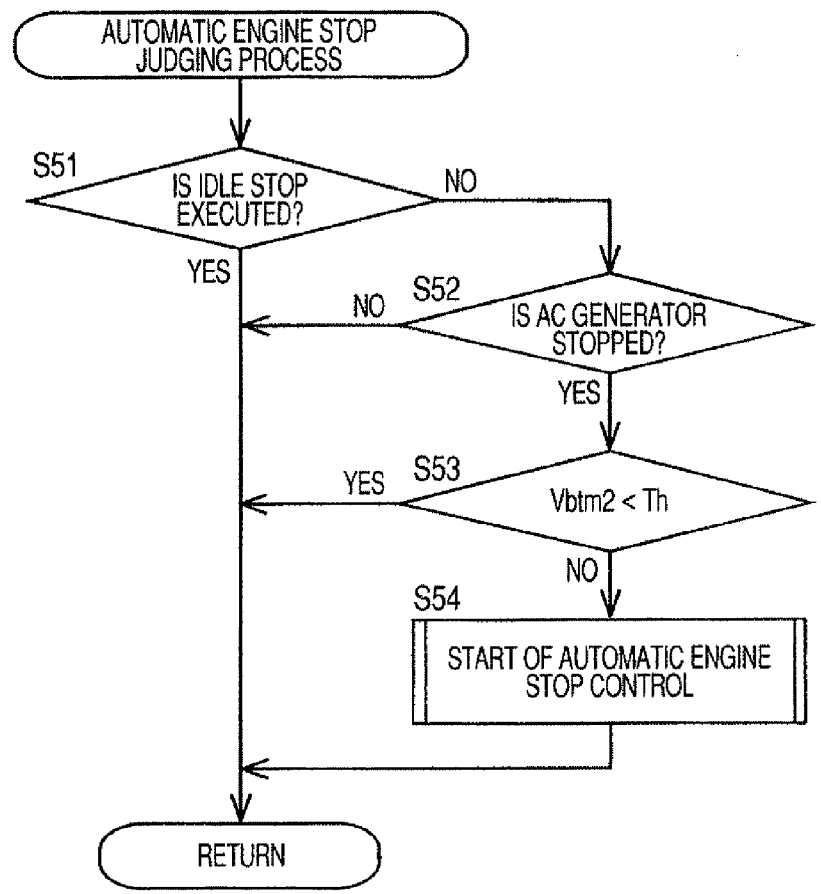
FIG. 16 is a flow chart showing a process to judge permission of an engine restart process performed by an automatic engine stop judging part in the ECU 170 according to the fourth embodiment of the present invention.

FIG. 16 is a flow chart showing the process to judge the permission of the engine restart process performed by the automatic engine stop judging part 173 in the ECU 170 according to the fourth embodiment of the present invention.

The automatic engine stop judging part 173 judges whether or not the engine 10 is in the engine idle stop state (step S51). When the judging result indicates that the engine 10 is in the engine idle stop state ("Yes" in step S51), the automatic engine stop judging part 173 completes the process shown in FIG. 16.

On the other hand, when the judging result indicates that the engine 10 is not in the engine idle stop state ("No" in step S51), the automatic engine stop judging part 173 judges whether or not the AC generator 21 is stopped or not (step S52). When the judging result indicates that the AC generator 21 is not stopped ("No" in step S52), the automatic engine stop judging part 173 completes the process shown in FIG. 16.

On the other hand, when the judging result indicates that the AC generator 21 is now stopped ("Yes" in step S52), the automatic engine stop judging part 173 judges whether or not the minimum voltage Vbtm2 of the battery 30 predicted by the minimum voltage predicting part 172 is less than the predetermined threshold value Th (step S53).

When the judging result indicates that the predicted minimum voltage Vbtm2 of the battery 30 is not less than the predetermined voltage threshold value Th ("No" in step S53), the automatic engine stop judging part 173 executes the engine idle stop (step S54).

On the other hand, when the judging result indicates that the predicted minimum voltage Vbtm2 of the battery 30 is less than the predetermined voltage threshold value Th ("Yes" in step S53), the automatic engine stop judging part 173 completes the process shown in FIG. 16. That is, the automatic engine stop judging part 173 does not execute the engine idle stop when the predicted minimum voltage Vbtm2 of the battery 30 is less than the predetermined voltage threshold value Th.

According to the fourth embodiment of the present invention, the judgment to permit the execution of the engine idle stop is performed based on the minimum voltage Vbtm2 of the battery 30 until the next restart of the engine when the engine idle stop is executed. In particular, this minimum voltage Vbtm2 of the battery 30 is predicted based on the maximum discharging current Is2 to be supplied from the battery 30 to the starter 60 during the period until the next restart of the engine. It is thereby possible to predict the minimum voltage Vbtm2 of the battery 30 during the period until the next restart of the engine during the engine idle stop executed for the constant period Tja.

That is, it is possible to prevent the voltage of the battery 30 from becoming less than the predetermined threshold value Th. As a result, it is possible to guarantee the engine restart with high reliability after performing the engine idle stop.

Fifth Embodiment

A description will be given of the automatic engine control device according to the fifth embodiment of the present invention with reference to FIG. 17, FIG. 18A, FIG. 18B, and FIG. 19.

The automatic engine control device according to the fifth embodiment judges whether or not the execution of the AC generator 21 is permitted in order to execute the engine idle stop when the engine 10 is working and the AC generator is stopped in operation.

This process is performed by an ECU 270 in the automatic engine control device according to the fifth embodiment. The ECU 170 is replaced with the ECU 70 in the structure of the automatic engine control device shown in FIG. 1.

The same components between the fifth embodiment and the first and fourth embodiments are referred with the same reference numbers, and the explanation for the same components is omitted here for brevity.

Figure 17:
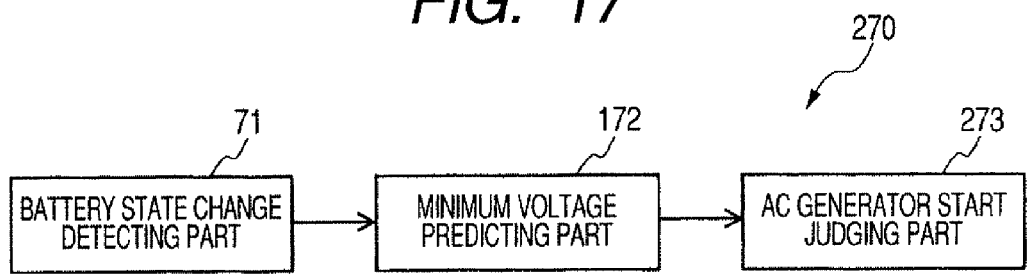
FIG. 17 is a block diagram showing functional blocks in an ECU 270 according to a fifth embodiment of the present invention.

FIG. 17 is a block diagram showing functional blocks in the ECU 270 according to the fifth embodiment of the present invention.

As shown in FIG. 17, the ECU 27 has the battery state change detection part 71, the minimum voltage predicting part 172, and an AC generator start judging means 273. This minimum voltage predicting part 172 corresponds to the "minimum voltage predicting means". The minimum voltage predicting part 172 executes the engine idle stop for the predetermined constant period Tja in order to predict the minimum voltage Vbtm2 of the battery 30 until the next restart of the engine when the engine 10 is working and the AC generator 21 is stopped.

The AC generator start judging means 273 judges whether or not the restart of the AC generator 21 is permitted in order to execute the engine idle stop based on the minimum voltage Vbtm2 of the battery 30 which is predicted by the minimum voltage predicting part 172. This AC generator start judging means 273 corresponds to the "AC generator start judging means".

Specifically, the AC generator start judging means 273 starts the operation of the AC generator when the predicted minimum voltage Vbtm2 of the battery 30 is less than the predetermined voltage threshed value Th when the engine 10 is working and the AC generator 21 is stopped.

That is, the AC generator start judging means 273 judges whether or not the execution of the AC generator 21 is permitted based on the predicted minimum voltage Vbtm2 of the battery 30 at the time when the engine idle stop is executed. This process of the AC generator start judging means 273 will now be explained with reference to FIG. 18A, FIG. 18B, and FIG. 19.

Figure 18A:
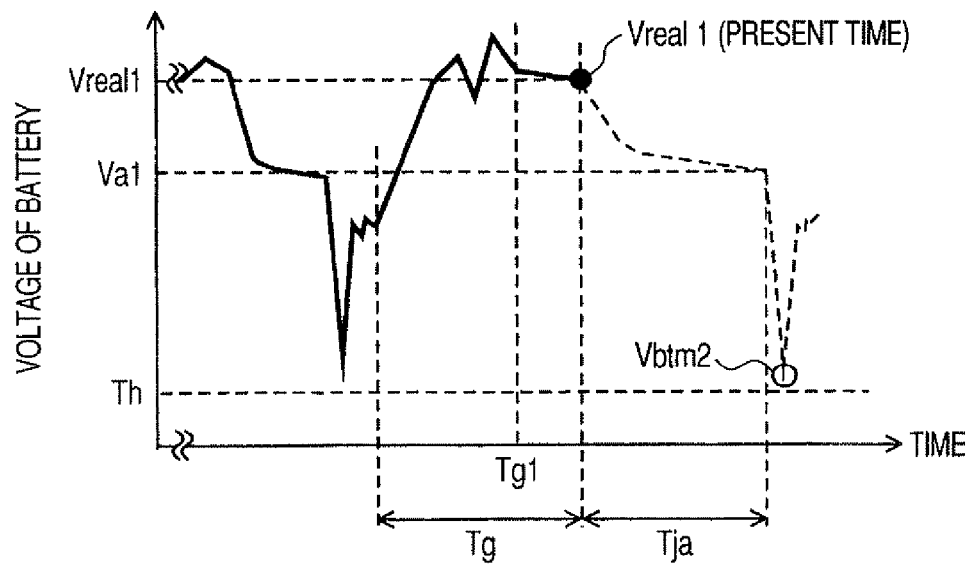
FIG. 18A and FIG. 18B, each is a view showing a voltage change of the battery in the time elapse during the execution of the engine idle stop after the engine works, in particular.
Figure 18B:
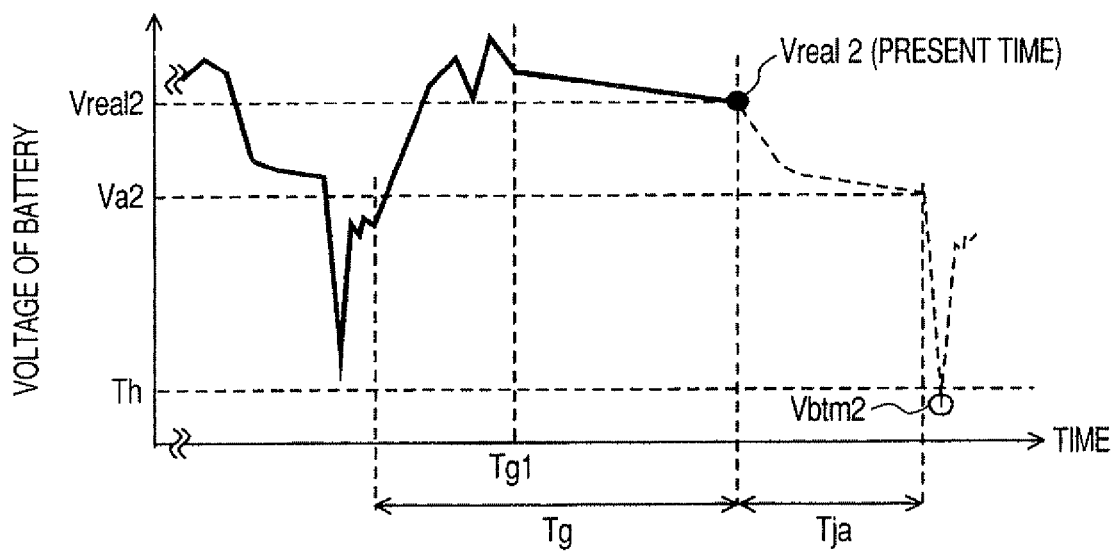
Figure 19:
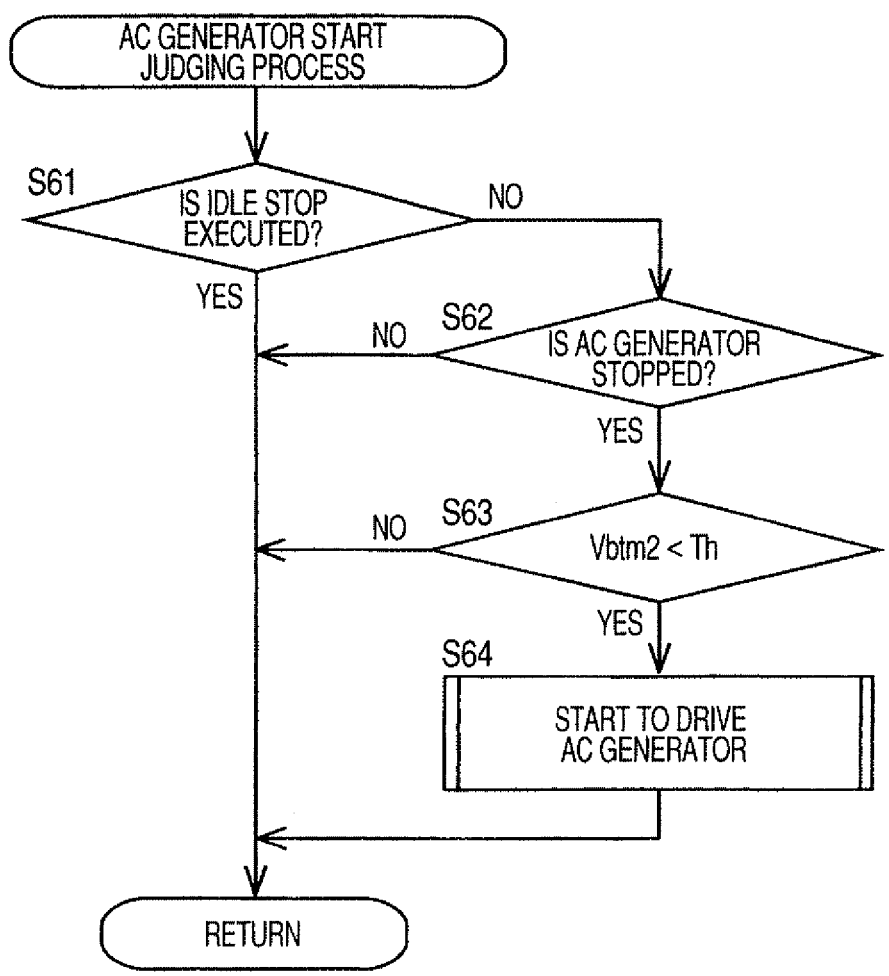
FIG. 19 is a flow chart showing a process to judge whether or not the execution of engine restart is permitted performed by an AC generator start judging part 273 in the ECU 270 according to the fifth embodiment of the present invention.

Each of FIG. 18A and FIG. 18B is a view showing a voltage change of the battery 30 in the time elapse during the execution of the engine idle stop after the engine works. In particular, FIG. 18A shows a case where the battery 30 has a voltage Vreal1 at the present time, and FIG. 18B shows a case where the battery 30 has a voltage Vreal2 at the present time. FIG. 19 is a flow chart showing the process to judge whether or not the engine restart is permitted or not performed by the AC generator start judging part 273 in the ECU 270 according to the fifth embodiment of the present invention.

As shown in FIG. 19, the AC generator start judging means 273 firstly judges whether or not the engine 10 is in the engine idle stop state (step S61). When the judgment result indicates that the engine 10 is now in the engine idle stop state ("Yes" in step S61), The AC generator start judging means 273 completes the process shown in FIG. 19.

On the other hand, when the judgment result indicates that the engine 10 is not in the engine idle stop state ("No" in step S61), the AC generator start judging means 273 judges whether or not the AC generator 21 is now stopped (step S62).

When the judging result indicates that the AC generator 21 is not stopped ("No" in step S56), the AC generator start judging means 273 completes the process shown in FIG. 19.

On the other hand, when the judging result indicates that the AC generator 21 is now stopped ("Yes" in step S62), the AC generator start judging means 273 judges whether or not the minimum voltage Vbtm2 of the battery 30 predicted by the minimum voltage predicting part 172 is less than the predetermined threshold value Th (step S63).

The time period after the timing Tg1 during the period Tg in which the engine 10 is working corresponds to the case where the engine 10 is not in the engine idle stop state and the AC generator 21 is stopped.

After this, the AC generator start judging means 273 judges whether or not the minimum voltage Vbtm2 of the battery 30, which is predicted when the engine idle stop is executed for the predetermined constant period Tja, is less than the predetermined voltage threshed value Th (step S63).

When the judging result indicates that the predicted minimum voltage Vbtm2 of the battery 30 is less than the predetermined voltage threshed value Th ("Yes" in step S63), the AC generator start judging means 273 starts the AC generator 21 to operate (step S64).

On the other hand, when the judging result indicates that the predicted minimum voltage Vbtm2 of the battery 30 is not less than the predetermined voltage threshed value Th ("No" in step S63), the AC generator start judging means 273 completes the process shown in FIG. 19. That is, the AC generator start judging means 273 instructs the AC generator 21 to starts its operation when the predicted minimum voltage Vbtm2 of the battery 30 is less than the predetermined voltage threshed value Th.

FIG. 18A shows the case where the battery 30 has the voltage Vreal1 at the present time, and the battery 30 has the voltage Va1 when the engine idle stop is executed for the predetermined constant period Tja, and the predicted minimum voltage Vbtm2 of the battery 30 is not less than the predetermined voltage threshed value Th. That is, FIG. 18A shows the case of not being necessary to start the AC generator 21 at the present time, and of starting the engine idle stop.

FIG. 18B shows the case where the battery 30 has a voltage Vreal2 at the present time and a voltage Va2 at the time when the engine idle stop is executed for the predetermined constant period Tja, and the predicted minimum voltage Vbtm2 of the battery 30 is less than the predetermined voltage threshed value Th. FIG. 18B shows the case where the battery 30 is charged until the voltage of the battery 30 reaches an adequate voltage level after the AC generator 21 starts in operation.

According to the fifth embodiment of the present invention, the AC generator start judging means 273 judges whether or not the execution of the AC generator is permitted based on the minimum voltage of the battery 30 during the period until the next restart of the engine when the engine idle stop is executed for the predetermined constant period Tja. The AC generator start judging means 273 calculates this predicted minimum voltage Vbtm2 of the battery 30 based on the maximum discharging current to be supplied from the battery 30 to the starter 60 during the period until the next restart of the engine when the engine idle stop is executed form the predetermined constant period Tja. This can predict the minimum voltage Vbtm2 of the battery 30 with high accuracy during the period until the next restart of the engine after the engine idle stop is executed from the predetermined constant period Tja. That is, the automatic engine control device according to the fifth embodiment can prevent the voltage of the battery 30 from becoming less than the predetermined voltage threshed value Th.

(Feature and Effects of the Present Invention)

In addition to the features and effects described in the Summary of the Invention section and the first to fifth embodiments previously described, the present invention has following features and effects.

In the automatic engine control device according to the first aspect of the present invention, the starter total resistance value calculating means calculates the starter total resistance value based on the voltage of the battery and the discharging current supplied from the battery to the starter which are detected when the starter has not yet started immediately after the voltage of the battery is supplied to the starter.

The time when the starter is not working corresponds to the time when the starter does not generate any back electromotive force. That is, the automatic engine control device according to the present invention detects the voltage and the discharging current of the battery when the a back electromotive force is not generated by the starter. Accordingly, the starter total resistance value is easily obtained by using Ohm's law. As a result, it is possible for the automatic engine control device to calculate a voltage drop amount of the battery with high accuracy.

In the first aspect of the present invention, the automatic engine control device further has a past discharging current obtaining means and a past voltage obtaining means. The past discharging current obtaining means obtains a past discharging current value supplied from the battery to the starter at an initial start of the engine or a past restart of the engine. The past voltage obtaining means obtains a past voltage at the initial start of the engine or the past restart of the engine. In the automatic engine control device, the starter total resistance value calculating means calculates the starter total resistance value based on the past discharging current value obtained by the past discharging current obtaining means and the past voltage value obtained by the past voltage obtaining means.

In general, direct detection of the wiring resistance of the conductive wiring and the internal resistance value of the starter requires to use a voltage sensor and a current sensor. However, the automatic engine control device according to the present invention can detect the starter total resistance value without using any voltage sensor and current sensor. That is, it is possible for the automatic engine control device according to the present invention to detect the voltage of the battery with high accuracy when the engine restarts. That is, the automatic engine control device according to the present invention makes it possible to predict the voltage of the battery when the engine restarts with high accuracy and low cost.

In the first aspect of the present invention, the automatic engine control device further has a past battery internal resistance value obtaining means, and a past voltage drop amount calculating means. The past battery internal resistance value obtaining means obtains a past battery internal resistance value of the battery at the initial start of the engine or the past restart of the engine. The past voltage drop amount calculating means calculates a past voltage drop amount of the battery during a period counted from a timing when the engine starts to a timing when the voltage of the battery has a minimum value at the initial start of the engine or the past restart of the engine. In the automatic engine control device according to the present invention, the past discharging current obtaining means calculates the past discharging current value based on the past battery internal resistance value obtained by the past battery internal resistance value obtaining means and the past voltage drop amount of the battery obtained by the past voltage drop amount calculating means.

In general, a large amount discharging current flows from the battery to the starter when the engine restarts. In order to directly detect the discharging current when the engine restarts, it is necessary to use a current sensor with an extremely wide detection range. On the other hand, the automatic engine control device according to the present invention does not directly detect a discharging current from the battery when the engine restarts, and to calculate the discharging current of the battery based on the past internal resistance value of the battery and the past voltage drop amount of the battery. Accordingly, the automatic engine control device according to the present invention can calculate the discharging current of the battery when the engine restarts without any current sensor of a high detection range. This makes it possible to predict the voltage of the battery when the engine restarts with high accuracy and low cost because of not requiring any current sensor with high detection range.

In the automatic engine control device as the first aspect of the present invention, the voltage of the battery predicted by the voltage predicting means is a voltage of the battery after the voltage drop caused by supplying the discharging current from the battery to the starter.

Supplying a discharging current into the starter decreases the voltage of the battery. That is, the present invention can predict the voltage of the battery with high accuracy with which the ECU 70 judges whether or not the execution of the next restart of the engine is permitted.

In the automatic engine control device as the first aspect of the present invention, the past discharging current value obtained by the past discharging current obtaining means is value of a discharging current supplied from the battery to the starter at the last engine start. Further, the past voltage value obtained by the past voltage obtaining means is a voltage of the battery at the last start of the engine.

There is a possibility that the present state of the battery and other devices is greatly different from the past state of them when the automatic engine control device uses past data items which are obtained during the period counted from several times of past restart of the engine to the present time. That is, there is a possibility that the past data items to be used to predict the voltage of the battery when the next restart of the engine are different from actual data items at the present time. The automatic engine control device according to the present invention uses the voltage of the battery immediately after the last restart of the engine, and predicts the voltage of the battery at the next restart of the engine. That is, because the past data items obtained at the last restart of the engine mostly close to the data items obtained from the battery and devices at the present time, the automatic engine control device according to the present invention can predict the voltage of the battery with high accuracy at the next restart of the engine.

In the automatic engine control device as the first aspect of the present invention, the starter total resistance value calculating means uses a predetermined resistance value as the starter total resistance value when the voltage detection means cannot detect a voltage of the battery at a timing immediately before the initial start of the engine and a minimum voltage of the battery at the initial start of the engine.

When the vehicle driver initially and turns on the ignition key of the vehicle, which is faster than normal, to start the engine (for example, at the initial start of the engine after the vehicle is parked), the ECU cannot detect the voltage of the battery immediately before the engine starts and the minimum voltage of the battery at a timing when the starter starts. Because the engine starts before the ECU normally works, there is a possibility for the ECU not to obtain the voltage of the battery immediately before the engine starts and the minimum voltage of the battery when the starter starts to work.

When the engine enters in the first idle stop after the initial start of the engine, it is impossible for the ECU to estimate the minimum voltage of the battery at the next restart of the engine. This makes it impossible to detect a possible voltage range of the battery after the engine idle stop, and it is thereby impossible to execute the engine idle stop.

The automatic engine control device according to the present invention can execute the engine idle stop with high reliability because of using the predetermined value as the starter total resistance value even if the automatic engine control device cannot obtain the voltage of the battery immediately before the initial start of the engine and the minimum voltage of the battery when the engine restarts. This predetermined resistance value is obtained in advance while considering a changeable range in environmental condition and metal deterioration.

In the automatic engine control device as the first aspect of the present invention, the predetermined resistance value is a changeable value according to a temperature change. This makes it possible for the automatic engine control device to use a more optimum resistance value as the starter total resistance value even if the resistance value is changed according to the temperature change.

In a case when the voltage detection means cannot detect a voltage of the battery at a timing immediately before the initial start of the engine, and can obtain a minimum voltage of the battery at the initial start of the engine, the automatic engine control device according to the first aspect of the present invention further has an initial battery internal resistance obtaining means, a pseudo opening voltage estimating means, a voltage drop amount estimating means, and a discharging current obtaining means.

The initial battery internal resistance obtaining means obtains a battery internal resistance value of the battery during a cranking period at the initial start of the engine. The pseudo opening voltage estimating means estimates a pseudo opening voltage of the battery based on the battery internal resistance value obtained by the initial battery internal resistance obtaining means. The voltage drop amount estimating means estimates a voltage drop amount of the battery during a period counted from a timing before the initial start of the engine to a timing when the battery has a minimum voltage during the working of the engine based on the pseudo opening voltage is used as the voltage of the battery at a timing immediately before the initial start of the engine. The discharging current obtaining means calculates a discharging current of the battery based on the battery internal resistance value obtained by the initial battery internal resistance obtaining means and the voltage drop amount obtained by the voltage drop amount estimating means. In the automatic engine control device, the starter total resistance value calculating means calculates the starter total resistance value based on the discharging current obtained by the discharging current obtaining means and the minimum voltage of the battery.

When the vehicle driver operates to start the engine, namely, turns on the ignition key of the vehicle and the engine initially starts, there is a possibility that the ECU cannot detect the voltage of the battery immediately before the engine starts and the minimum voltage of the battery when the starter restarts. But, it is possible to detect the minimum voltage of the battery when the starter is driven even if the ECU cannot detect the voltage of the battery immediately before the initial start of the engine. It is thereby possible to the present invention to this case in order to calculate the starter total resistance value.

In the automatic engine control device according to the second aspect of the present invention, the starter total resistance value calculating means calculates the starter total resistance value based on the voltage of the battery and the maximum discharging current supplied from the battery to the starter which are detected when the starter has not yet started immediately after the voltage of the battery is supplied to the starter.

In the second aspect of the present invention, the timing when the starter is not working corresponds to the timing when a back electromotive force is not generated by the starter. That is, the automatic engine control device according to the present invention detects the voltage and the discharging current of the battery when a back electromotive force is not generated by the starter. Accordingly, the starter total resistance value is easily obtained by using Ohm's law. As a result, this makes it possible for the automatic engine control device to calculate a voltage drop amount of the battery with high accuracy.

In the second aspect of the present invention, the automatic engine control device further has a past maximum discharging current obtaining means and a past minimum voltage obtaining means. The past maximum discharging current obtaining means obtains a past maximum discharging current supplied from the battery to the starter at an initial start of the engine or a past restart of the engine. The past minimum voltage obtaining means obtains a past minimum voltage at the initial start of the engine or the past restart of the engine. In the automatic engine control device, the starter total resistance value calculating means calculates the starter total resistance value based on the past maximum discharging current obtained by the past maximum discharging current obtaining means and the past minimum voltage value obtained by the past minimum voltage obtaining means.

In general, direct detection of the wiring resistance of the conductive wiring and the internal resistance value of the starter requires a voltage sensor and a current sensor. However, the automatic engine control device according to the second aspect of the present invention can detect the starter total resistance value without using any voltage sensor and current sensor. That is, it is possible for the automatic engine control device according to the present invention to detect the voltage of the battery with high accuracy when the engine restarts. That is, the automatic engine control device according to the present invention makes it possible to predict the voltage of the battery when the engine restarts with high accuracy and low cost.

In the second aspect of the present invention, the automatic engine control device further has a past battery internal resistance value obtaining means, and a past voltage drop amount calculating means. The past battery internal resistance value obtaining means obtains a past battery internal resistance value of the battery at the initial start of the engine or the past restart of the engine. The past voltage drop amount calculating means calculates a past voltage drop amount of the battery during a period counted from a timing when the engine starts to a timing when the voltage of the battery has a minimum value at the initial start of the engine or the past restart of the engine. In the automatic engine control device according to the second aspect of the present invention, the past maximum discharging current obtaining means calculates the past maximum discharging current value based on the past battery internal resistance value obtained by the past battery internal resistance value obtaining means and the past voltage drop amount of the battery obtained by the past voltage drop amount calculating means.

In general, a large amount discharging current flows from the battery to the starter when the engine restarts. In order to directly detect the discharging current when the engine restarts, it is necessary to use a current sensor with an extremely wide detection range. On the other hand, the automatic engine control device according to second aspect of the present invention does not directly detect a discharging current from the battery when the engine restarts, and to calculate the discharging current of the battery based on the past internal resistance value of the battery and the past voltage drop amount of the battery. Accordingly, the automatic engine control device according to the present invention can calculate the discharging current of the battery when the engine restarts without any current sensor of a high detection range. This makes it possible to predict the voltage of the battery when the engine restarts with high accuracy and low cost because of not requiring any current sensor with high detection range.

In the automatic engine control device according to the second aspect of the present invention, the minimum voltage of the battery predicted by the minimum voltage predicting means is a minimum voltage of the battery when the voltage of the battery drops by supplying the maximum discharging current to the starter.

Supplying a maximum discharging current into the starter typically decreases the voltage of the battery. That is, the second aspect of the present invention can predict the minimum voltage of the battery with high accuracy in order to judge the permission of the engine restart.

In the automatic engine control device according to the second aspect of the present invention, the past maximum discharging current obtained by the past maximum discharging current obtaining means is a maximum discharging current supplied from the battery to the starter at the last engine start, and the past minimum voltage value obtained by the past minimum voltage obtaining means is a minimum voltage of the battery at the last engine start.

There is a possibility that the present state of the battery and other devices is greatly different from the past state of them when the automatic engine control device uses past data from several times of past restart of the engine to the present time. That is, there is a possibility that the past data items to be used to predict the voltage of the battery when the next restart of the engine are different from actual data items. The automatic engine control device according to the second aspect of the present invention uses the voltage of the battery immediately at the last restart of the engine, and predicts the voltage of the battery at the next restart of the engine. That is, because the past data obtained at the last restart of the engine mostly close to the data obtained from the battery and the devices at the present time, the automatic engine control device according to the present invention can predict the voltage of the battery with high accuracy at the next restart of the engine.

In the automatic engine control device according to the second aspect of the present invention, the starter total resistance value calculating means uses a predetermined resistance value as the starter total resistance value when the voltage detection means cannot detect a voltage of the battery at a timing immediately before the initial start of the engine and a minimum voltage of the battery at the initial start of the engine.

When the vehicle driver initially turns on the ignition key of the vehicle, which is faster than normal, to start the engine (for example, when the engine initially starts after the vehicle is parked), the ECU cannot detect the voltage of the battery immediately before the engine starts and the minimum voltage of the battery at a timing to start the starter. Because the engine starts before the ECU normally works, there is a possibility for the ECU not to obtain the voltage of the battery immediately before the engine starts and the minimum voltage of the battery when the starter starts to work, as previously described in the explanation of the first aspect of the present invention.

According to the second aspect of the present invention, it is possible to execute the engine idle stop with high reliability because the automatic engine control device uses the predetermined value as the starter total resistance value even if the automatic engine control device cannot obtain the voltage of the battery immediately before the initial start of the engine and the minimum voltage of the battery when the engine restarts. This predetermined resistance value is obtained in advance while considering a changeable range in environmental condition and metal deterioration.

In the automatic engine control device according to the second aspect of the present invention, the predetermined resistance value is a changeable value according to a temperature change. This makes it possible for the automatic engine control device to use a more optimum resistance value as the starter total resistance value even if the resistance value is changed according to the temperature change.

In a case when the voltage detection means cannot detect a voltage of the battery at a timing immediately before the initial start of the engine, and can obtain a minimum voltage of the battery at the initial start of the engine, the automatic engine control device according to the second aspect of the present invention further has an initial battery internal resistance obtaining means, a pseudo opening voltage estimating means, a voltage drop amount estimating means, and a discharging current obtaining means. The initial battery internal resistance obtaining means obtains a battery internal resistance value of the battery during a cranking period at the initial start of the engine. The pseudo opening voltage estimating means estimates a pseudo opening voltage of the battery based on the battery internal resistance value obtained by the initial battery internal resistance obtaining means. The voltage drop amount estimating means estimates a voltage drop amount of the battery during a period counted from a timing before the initial start of the engine to a timing when the battery has a minimum voltage during the working of the engine based on the pseudo opening voltage is used as the voltage of the battery at a timing immediately before the initial start of the engine. The discharging current obtaining means calculates a discharging current of the battery based on the battery internal resistance value obtained by the initial battery internal resistance obtaining means and the voltage drop amount obtained by the voltage drop amount estimating means. The starter total resistance value calculating means calculates the starter total resistance value based on the discharging current obtained by the discharging current obtaining means and the minimum voltage of the battery.

When the vehicle driver operates to start the engine, such as the ignition key of the vehicle, and the engine initially starts, there is a possibility that the ECU cannot detect the voltage of the battery immediately before the engine starts and the minimum voltage of the battery when the starter restarts. But, there is a case to detect the minimum voltage of the battery when the starter is driven even if the ECU cannot detect the voltage of the battery immediately before the initial start of the engine. It is thereby possible to the present invention to this case in order to calculate the starter total resistance value.

(Common Features Between the First and Second Aspects of the Present Invention)

According to the present invention, the automatic engine control device further has a past battery internal resistance value obtaining means and a battery state change detecting means. The past battery internal resistance value obtaining means obtains a past battery internal resistance value of the battery at the initial start of the engine or the past restart of the engine. The battery state change detecting means detects a battery state change during a period counted from a timing when the past battery internal resistance value obtaining means detects the past battery internal resistance value to a present timing. In the automatic engine control device according to the present invention, the present battery internal resistance value obtaining means compensates the past battery internal resistance value obtained by the past battery internal resistance value obtaining means based on the battery state change, and calculates the present battery internal resistance value based on the compensated past battery internal resistance value.

It is possible to calculate the internal resistance value of the battery with high accuracy based on the maximum discharging current and the minimum voltage of the battery when the engine starts by using Ohm's law. The internal resistance value of the battery is changed by the state change of the battery. That is, the internal resistance value of the battery at the next restart of the engine is in general different from the internal resistance value of the battery detected in the past.

The automatic engine control device according to the present invention calculates the present internal resistance value of the battery with high accuracy by compensating the present internal resistance value of the battery in accordance with the state change of the battery based on the past internal resistance value of the battery with high accuracy obtained in the past. Accordingly, it is possible to predict the minimum voltage of the battery with high accuracy at the next restart of the engine.

In the automatic engine control device according to the present invention, the battery state change detected by the battery state change detecting means includes the SOC of the battery.

In general, the SOC as a residual capacity of the battery affects the magnitude of the internal resistance value of the battery. That is, adding the SOC of the battery into the parameters to show the battery state change can predict the minimum voltage of the battery with high accuracy at the next restart of the engine.

In the automatic engine control device according to the present invention, the battery state change detected by the battery state change detecting means includes a time-integrated value of a charging/discharging current during a period counted from a timing when the battery internal resistance value is obtained to a present timing.

In general, the internal resistance value of the battery depends on a time-integral value of the charging/discharging current of the battery after a reference timing, where the reference timing is a time to detect the internal resistance value of the battery in the past. That is, adding the time-integral value of the charging/discharging current of the battery into the parameters to shown the battery state change can predict the minimum voltage of the battery with high accuracy at the next restart of the engine.

In the automatic engine control device according to the present invention, the battery state change detected by the battery state change detecting means includes a temperature change of the battery.

In general, the internal resistance value of the battery depends on the temperature change of the battery. That is, adding the temperature change of the battery into the parameters showing the battery state change can predict the minimum voltage of the battery with high accuracy at the next restart of the engine. For example, it is possible only to use the temperature change of the battery, or to use both the temperature change and the SOC as a residual capacity of the battery, or use the temperature change and the time-integral value of the charging/discharging current of the battery in order to calculate the internal resistance value of the battery.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. An automatic engine control device that controls an automatic engine stop and a restart of an internal combustion engine mounted to a vehicle, comprising:
   a battery capable of charging and discharging electric power;
   a starter, electrically connected to the battery through a conductive wiring, that works to start the internal combustion engine when receiving the electric power supplied from the battery;
   voltage detection means that detects a voltage of the battery;
   present battery internal resistance value obtaining means that obtains a present internal resistance value of the battery;
   starter total resistance value calculating means that calculates a starter total resistance value by adding an internal resistance value of the starter and a wiring resistance value of the conductive wiring;

discharging current predicting means that predicts a discharging current to be supplied from the battery to the starter based on a present voltage of the battery detected during an automatic engine stop by the voltage detection means, the present internal resistance value of the battery detected during the automatic engine stop by the present battery internal resistance value obtaining means, and the starter total resistance value detected during the automatic engine stop by the starter total resistance value calculating means;

voltage predicting means that predicts a voltage of the battery during a period of the automatic engine stop until a next restart of the engine based on the present voltage detected during the automatic engine stop by the voltage detection means, the present internal resistance value of the battery detected during the automatic engine stop by the present battery internal resistance value obtaining means, and the predicted discharging current;

engine restart judging means that judges, during the automatic engine stop, whether or not the next restart of the engine is permitted based on the predicted voltage of the battery; and control means that controls the automatic engine stop and the restart of the internal combustion engine based on a judgment result of the engine restart judging means;

wherein in a case when the voltage detection means cannot detect the voltage of the battery at a timing immediately before an initial start of the engine, and can obtain a minimum voltage of the battery at the initial start of the engine, the automatic engine control device further comprises:

initial battery internal resistance obtaining means that obtains a battery internal resistance value of the battery during a cranking period at the initial start of the engine;

pseudo opening voltage estimating means that estimates a pseudo opening voltage of the battery based on the battery internal resistance value obtained by the initial battery internal resistance obtaining means;

voltage drop amount estimating means that estimates a voltage drop amount of the battery during a period counted from a timing before the initial start of the engine to a timing when the battery has a minimum voltage during a working of the engine based on the pseudo opening voltage is used as the voltage of the battery at a timing immediately before the initial start of the engine; and discharging current obtaining means that calculates a discharging current of the battery based on the battery internal resistance value obtained by the initial battery internal resistance obtaining means and the voltage drop amount obtained by the voltage drop amount estimating means, wherein the starter total resistance value calculating means calculates the starter total resistance value based on the discharging current obtained by the discharging current obtaining means and the minimum voltage of the battery.

2. The automatic engine control device according to claim 1, wherein the starter total resistance value calculating means calculates the starter total resistance value based on the voltage of the battery and the discharging current supplied from the battery to the starter which are detected when the starter has not yet started immediately after the voltage of the battery is supplied to the starter.

3. The automatic engine control device according to claim 2, further comprising:

past discharging current obtaining means that obtains a past discharging current value supplied from the battery to the starter at the initial start of the engine or a past restart of the engine; and past voltage obtaining means that obtains a past voltage at the initial start of the engine or the past restart of the engine, wherein the starter total resistance value calculating means calculates the starter total resistance value based on the past discharging current value obtained by the past discharging current obtaining means and the past voltage value obtained by the past voltage obtaining means.

4. The automatic engine control device according to claim 3, further comprising:

past battery internal resistance value obtaining means that obtains a past battery internal resistance value of the battery at the initial start of the engine or the past restart of the engine; and past voltage drop amount calculating means that calculates a past voltage drop amount of the battery during a period counted from a timing when the engine starts to a timing when the voltage of the battery has a minimum value at the initial start of the engine or the past restart of the engine, wherein the past discharging current obtaining means calculates the past discharging current value based on the past battery internal resistance value obtained by the past battery internal resistance value obtaining means and the past voltage drop amount of the battery obtained by the past voltage drop amount calculating means.

5. The automatic engine control device according to claim 1, wherein the voltage of the battery predicted by the voltage predicting means is a voltage of the battery when the voltage of the battery drops by supplying the discharging current to the starter.

6. The automatic engine control device according to claim 3, wherein the past discharging current value obtained by the past discharging current obtaining means is a value of a discharging current supplied from the battery to the starter at the last engine start, and the past voltage value obtained by the past voltage obtaining means is a voltage of the battery at the last engine start.

7. The automatic engine control device according to claim 1, wherein the starter total resistance value calculating means uses a predetermined resistance value as the starter total resistance value when the voltage detection means cannot detect a voltage of the battery at the timing immediately before the initial start of the engine and the minimum voltage of the battery at the initial start of the engine.

8. The automatic engine control device according to claim 7, wherein the predetermined resistance value is a changeable value according to a temperature change.

9. An automatic engine control device that controls an automatic engine stop and a restart of an internal combustion engine mounted to a vehicle, comprising:

a battery capable of charging and discharging electric power;

a starter, electrically connected to the battery through a conductive wiring, that works to start the internal combustion engine when receiving electric power supplied from the battery;

voltage detection means that detects a voltage of the battery;

present battery internal resistance value obtaining means that obtains a present internal resistance value of the battery;

starter total resistance value calculating means that calculates a starter total resistance value by adding an internal resistance value of the starter and a wiring resistance value of the conductive wiring;

maximum discharging current predicting means that predicts a maximum discharging current to be supplied from the battery to the starter based on a present voltage of the battery detected during an automatic engine stop by the voltage detection means, the present internal resistance value of the battery detected during the automatic engine stop by the present battery internal resistance value obtaining means, and the starter total resistance value detected during the automatic engine stop by the starter total resistance value calculating means;

minimum voltage predicting means that predicts a minimum voltage of the battery during a period of the automatic engine stop until a next restart of the engine based on the present voltage detected during the automatic engine stop by the voltage detection means, the present internal resistance value of the battery detected during the automatic engine stop by the present battery internal resistance value obtaining means, and the predicted maximum discharging current;

engine restart judging means that judges, during the automatic engine stop, whether or not the next restart of the engine is permitted based on the predicted minimum voltage of the battery; and control means that controls the automatic engine stop and the restart of the internal combustion engine based on a judgment result of the engine restart judging means;

wherein in a case when the voltage detection means cannot detect a voltage of the battery at a timing immediately before an initial start of the engine, and can obtain a minimum voltage of the battery at the initial start of the engine, the automatic engine control device further comprises:

initial battery internal resistance obtaining means that obtains a battery internal resistance value of the battery during a cranking period at the initial start of the engine;

pseudo opening voltage estimating means that estimates a pseudo opening voltage of the battery based on the battery internal resistance value obtained by the initial battery internal resistance obtaining means;

voltage drop amount estimating means that estimates a voltage drop amount of the battery during a period counted from a timing before the initial start of the engine to a timing when the battery has a minimum voltage during the working of the engine based on the pseudo opening voltage is used as the voltage of the battery at a timing immediately before the initial start of the engine; and discharging current obtaining means that calculates a discharging current of the battery based on the battery internal resistance value obtained by the initial battery internal resistance obtaining means and the voltage drop amount obtained by the voltage drop amount estimating means, wherein the starter total resistance value calculating means calculates the starter total resistance value based on the discharging current obtained by the discharging current obtaining means and the minimum voltage of the battery.

10. The automatic engine control device according to claim 9, wherein the starter total resistance value calculating means calculates the starter total resistance value based on the voltage of the battery and the maximum discharging current supplied from the battery to the starter which are detected when the starter has not yet started immediately after the voltage of the battery is supplied to the starter.

11. The automatic engine control device according to claim 10, further comprising:

past maximum discharging current obtaining means that obtains a past maximum discharging current supplied from the battery to the starter at the initial start of the engine or a past restart of the engine; and past minimum voltage obtaining means that obtains a past minimum voltage at the initial start of the engine or the past restart of the engine, wherein the starter total resistance value calculating means calculates the starter total resistance value based on the past maximum discharging current obtained by the past maximum discharging current obtaining means and the past minimum voltage value obtained by the past minimum voltage obtaining means.

12. The automatic engine control device according to claim 11, further comprising:

past battery internal resistance value obtaining means that obtains a past battery internal resistance value of the battery at the initial start of the engine or the past restart of the engine; and past voltage drop amount calculating means that calculates a past voltage drop amount of the battery during a period counted from a timing when the engine starts to a timing when the voltage of the battery has a minimum value at the initial start of the engine or the past restart of the engine, wherein the past maximum discharging current obtaining means calculates the past maximum discharging current value based on the past battery internal resistance value obtained by the past battery internal resistance value obtaining means and the past voltage drop amount of the battery obtained by the past voltage drop amount calculating means.

13. The automatic engine control device according to claim 9, wherein the minimum voltage of the battery predicted by the minimum voltage predicting means is a minimum voltage of the battery when the voltage of the battery drops by supplying the maximum discharging current to the starter.

14. The automatic engine control device according to claim 3, wherein the past maximum discharging current obtained by the past maximum discharging current obtaining means is a maximum discharging current supplied from the battery to the starter at the last engine start, and the past minimum voltage value obtained by the past minimum voltage obtaining means is a minimum voltage of the battery at the last engine start.

15. The automatic engine control device according to claim 9, wherein the starter total resistance value calculating means uses a predetermined resistance value as the starter total resistance value when the voltage detection means cannot detect a voltage of the battery at a timing immediately before the initial start of the engine and the minimum voltage of the battery at the initial start of the engine.

16. The automatic engine control device according to claim 15, wherein the predetermined resistance value is a changeable value according to a temperature change.

17. An automatic engine control device that controls an automatic engine stop and a restart of an internal combustion engine mounted to a vehicle, comprising:

a battery capable of charging and discharging electric power;

a starter, electrically connected to the battery through a conductive wiring, that works to start the internal combustion engine when receiving the electric power supplied from the battery;

voltage detection means that detects a voltage of the battery;

present battery internal resistance value obtaining means that obtains a present internal resistance value of the battery;

starter total resistance value calculating means that calculates a starter total resistance value by adding an internal resistance value of the starter and a wiring resistance value of the conductive wiring:

discharging current predicting means that predicts a discharging current to be supplied from the battery to the starter based on a present voltage of the battery detected during an automatic engine stop by the voltage detection means, the present internal resistance value of the battery detected during the automatic engine stop by the present battery internal resistance value obtaining means, and the starter total resistance value detected during the automatic engine stop by the starter total resistance value calculating means;

voltage predicting means that predicts a voltage of the battery during a period of the automatic engine stop until a next restart of the engine based on the present voltage detected during the automatic engine stop by the voltage detection means, the present internal resistance value of the battery detected during the automatic engine stop by the present battery internal resistance value obtaining means, and the predicted discharging current;

engine restart judging means that judges, during the automatic engine stop, whether or not the next restart of the engine is permitted based on the predicted voltage of the battery;

control means that controls the automatic engine stop and the restart of the internal combustion engine based on a judgment result of the engine restart judging means:

past battery internal resistance value obtaining means that obtains a past battery internal resistance value of the battery at the initial start of the engine or the past restart of the engine; and battery state change detecting means that detects a battery state change during a period counted to a present timing from a timing when the past battery internal resistance value obtaining means detects the past battery internal resistance value, wherein the present battery internal resistance value obtaining means compensates the past battery internal resistance value obtained by the past battery internal resistance value obtaining means based on the battery state change, and calculates the present battery internal resistance value based on the compensated past battery internal resistance value.

18. The automatic engine control device according to claim 17, wherein the battery state change detected by the battery state change detecting means includes a SOC of the battery.

19. The automatic engine control device according to claim 17, wherein the battery state change detected by the battery state change detecting means includes a time-integrated value of a charging/discharging current during a period counted from a timing when the battery internal resistance value is obtained to a present timing.

20. The automatic engine control device according to claim 17, wherein the battery state change detected by the battery state change detecting means includes a temperature change of the battery.

* * * * *